United States Patent
Sato

(10) Patent No.: US 6,889,348 B2
(45) Date of Patent: May 3, 2005

(54) TESTER ARCHITECTURE CONSTRUCTION DATA GENERATING METHOD, TESTER ARCHITECTURE CONSTRUCTING METHOD AND TEST CIRCUIT

(75) Inventor: Masayuki Sato, Takasaki (JP)

(73) Assignee: Renesas Technology Corporation, Tokyo (JP)

( * ) Notice: Subject to any disclaimer, the term of this patent is extended or adjusted under 35 U.S.C. 154(b) by 599 days.

(21) Appl. No.: 09/908,776

(22) Filed: Jul. 20, 2001

(65) Prior Publication Data
US 2002/0038439 A1 Mar. 28, 2002

(30) Foreign Application Priority Data

Jul. 31, 2000 (JP) .................................. 2000-231435
Jul. 4, 2001 (JP) .................................. 2001-203776

(51) Int. Cl.[7] .............................................. G01R 31/28

(52) U.S. Cl. ...................................... 714/724; 324/765

(58) Field of Search .......................... 714/724; 324/765

(56) References Cited

U.S. PATENT DOCUMENTS

| 5,883,905 | A | * | 3/1999 | Eastburn ...................... 714/738 |
| 5,931,953 | A | * | 8/1999 | Lesmeister .................. 713/500 |
| 5,935,256 | A | * | 8/1999 | Lesmeister .................. 713/400 |
| 6,357,027 | B1 | * | 3/2002 | Frankowsky ................ 714/738 |

* cited by examiner

Primary Examiner—Albert DeCady
Assistant Examiner—Esaw Abraham
(74) Attorney, Agent, or Firm—Reed Smith LLP; Stanley P. Fisher, Esq.; Juan Carlos A. Marquez, Esq.

(57) ABSTRACT

The present invention provides a test circuit configuration technology suitable for use in a semiconductor device, which is capable of testing the semiconductor device without using a commercially-available tester (test device) and is less reduced in required cost. A test program related to a semiconductor device to be tested, which is described in tester language, is analyzed. Components of a test circuit (ALPG), corresponding to the contents of each test to be carried out are extracted, i.e., unwanted or unnecessary components are deleted to thereby generate the description (test circuit architecture construction data) of a circuit capable of conducting tests in desired test units according to HDL (Hardware Description Language).

27 Claims, 29 Drawing Sheets

FIG. 10

```
MPAT DIAGPING ;DIAGONAL PING PONG PAT
REGISTER
XMAX=#3FFE
YMAX=#3FFE
TPH=#00000
IDX1=#3FFE
IDX2=#3FFE
IDX3=#1FE
D3B=#1
PC=#000
START #0
      NOP XB<0 YB<0 D3<D3B TP<TPH
ST1: JNI1 ST1 W X<XB Y<YB XB<XB+1 YB<YB+1^BX
ST2: NOP    W X<XB Y<YB XC<XB+D3 YC<YB+D3/D
ST3: NOP    R X<XC Y<YC
      JNI2 ST3 R X<XB Y<YB XC<XC+D3 YC<YC+D3/D
      JNI3 ST2 W X<XB Y<YB XB<XB+1 YB<YB+1^BX D3<D3B
      NOP    W X<XB Y<YB XC<XB+D3 YC<YB+1^CY/D
ST4: NOP    R X<XC Y<YC
      JNI2 ST4 R X<XB Y<YB XC<XC+D3 YC<YC+D3/D
JZD ST1 W X<XB Y<YB XB<XB+1 YB<YB+1^BX D3<D3B
      NOP
      STOP
END
```

FIG. 14

```
MPAT MARCH
REGISTER
 XMAX=#3FFE
 YMAX=#3FFE
 TPH=#00000
 IDX1=#3FFE
 IDX2=#3FFE
 IDX3=#1FE
 D3B=#1
 PC=#000
START #0
     NOP XB<0 YB<0 TP<TPH
ST1: JNI1 ST1 W X<XB Y<YB XB<XB+1 YB<YB+1^BX
ST2: NOP   R X<XB Y<YB
     JNI1 ST2 W X<XB Y<YB XB<XB+1 YB<YB+1^BX /D
ST3: JNI1 ST3 R X<XB Y<YB XB<XB+1 YB<YB^BX /D
JZD ST1
     NOP
     STPS
END
```

FIG. 15

```
IF B35~37=#0 THEN PC=PC+1
IF B35~37=#1 AND JF1=0 THEN ENTRY
                              PC=OP
                              IDX=IDX1
                              IDXW1=IDX
                              JF1=1
                              EXIT
IF B35~37=#1 AND JF1=1 AND IDXW1=0
THEN ENTRY
                              PC=PC+1
                              JF1=0
                              EXIT
F B35~37=#2 AND JF2=1 AND IDXW2>0
THEN ENTRY
                              IDX=IDXW2
                              IDXW2=IDX-1
                              EXIT
IF B35~37=#2 AND JF2=0 THEN ENTRY
                              PC=OP
                              IDX=IDX2
                              IDXW2=IDX
                              JF2=1
                              EXIT
IF B35~37=#2 AND JF2=1 AND IDXW2=0
THEN ENTRY
                              PC=PC+1
                              JF1=0
                              EXIT
F B35~37=#2 AND JF2=1 AND IDXW2>0
THEN ENTRY
                              IDX=IDXW2
                              IDXW2=IDX-1
                              EXIT
IF B35~37=#3 AND JF3=0 THEN ENTRY
                              PC=OP
                              IDX=IDX3
                              IDXW3=IDX
                              JF3=1
                              EXIT
IF B35~37=#3 AND JF3=1 AND IDXW3=0
THEN ENTRY
                              PC =PC+1
                              JF3 =0
                              EXIT
F B35~37=#3 AND JF3=1 AND IDXW3>0
THEN ENTRY
                              IDX=IDXW3
                              IDXW3=IDX-1
                              EXIT
IF B35~37=#4 AND JF4=0 THEN ENTRY
                              PC=OP
                              IDX=IDX4
                              IDXW4=IDX
                              JF4=1
                              EXIT
IF B35~37=#4 AND JF4=1 AND IDXW4=0
THEN ENTRY
                              PC=PC+1
                              JF4=0
                              EXIT
IF B35~37=#4 AND JF4=1 AND IDXW4>0
THEN ENTRY
                              IDX=IDXW4
                              IDXW4=IDX-1
                              EXIT
IF B35~37=#5 AND DFLG=0 THEN ENTRY
                              PC=OP
                              DFLG=1
                              EXIT
IF B35~37=#5 AND DFLG=1 THEN ENTRY
                              PC=PC+1
                              DFLG=0
                              EXIT
IF B35~37=#6 THEN PC=OP
IF B35~37=#7 THEN STOP
```

FIG. 21

```verilog
module Sequence_Controller (PC, INPC,
    OPLAND, OPCODE, reset, clk,
    dflg_prev, IDX1, IDX2, IDX3);

output [0:9] PC;
reg [0:9] PC;
input [127:118] INPC;
wire [127:118] INPC;
input [112:103] OPLAND;
wire [112:103] OPLAND;
input [116:113] OPCODE;
wire [116:113] OPCODE;
input reset;
wire reset;
input clk;
wire clk;
output dflg_prev;
reg dflg_prev;
input [11:0] IDX1;
wire [11:0] IDX1;
input [11:0] IDX2;
wire [11:0] IDX2;
input [11:0] IDX3;
wire [11:0] IDX3;
integer dflg;
reg [25:0] idx1;
reg [25:0] idx2;
reg [25:0] idx3;
reg [25:0] idx4;
reg [25:0] idx5;
reg [25:0] idx6;
reg [25:0] idx7;
reg [25:0] idx8;
reg [25:0] idxw1;
reg [25:0] idxw2;
reg [25:0] idxw3;
reg [25:0] idxw4;
reg [25:0] idxw5;
reg [25:0] idxw6;
reg [25:0] idxw7;
reg [25:0] idxw8;
reg [25:0] idx;
reg jf1;
reg jf2;
reg jf3;
reg jf4;

always @(posedge clk)
begin :Start
    if (reset) begin
        PC = 0;
        jf1 = 0;
        jf2 = 0;
        jf3 = 0;
        jf4 = 0;
        idxw1 = 0;
        idxw2 = 0;
        idxw3 = 0;
        idxw4 = 0;
        idx = 0;
        dflg = 0; end
    else begin
        opland = OPLAND;
        opcode = OPCODE;
        idx1 = IDX1;
        idx2 = IDX2;
        idx3 = IDX3;
        idx4 = 0;
        idx5 = 0;
        idx6 = 0;
        idx7 = 0;
        idx8 = 0;
        case (OPCODE)
            0 : begin
                PC = INPC + 1;
                end
            1 : begin
                if (jf1 == 0) begin
                    PC = opland;
                    idx = idx1;
                    idxw1 = idx;
                    jf1 = 1; end
                else if (jf1 == 1) begin
                    if (idxw1 == 0) begin
                        PC = INPC + 1;
                        jf1 = 0; end
                    else if (idxw1 != 0) begin
                        PC = opland;
                        idxw1 = idxw1;
                        idxw1 = idx - 1; end
                end
                end
            2 : begin
                if (jf2 == 0) begin
                    PC = opland;
                    idx = idx2;
                    idxw2 = idx;
                    jf2 = 1; end
                else if (jf2 == 1) begin
                    if (idxw2 == 0) begin
                        PC = INPC + 1;
                        jf2 = 0; end
                    else if (idxw2 != 0) begin
                        PC = opland;
                        idx = idxw2;
                        idxw2 = idx - 1; end
                end
                end
            ~~OMISSION~~
            11 : begin
                    if (dflg == 0) begin
                        PC = opland;
                        dflg = 1 ; end
                    else if (dflg == 1) begin
                        PC = INPC + 1;
                        dflg = 0; end
                end
            12 : begin
                    PC = opland;
                end
            15 : begin
                    PC = INPC;    $finish
                end
        endcase
        dflg_prev = dflg;
    end
end endmodule
```

~~OMISSION~~

FIG. 22

```
module Instruction_Memory (PC, B, M_EN_BAR, WE_BAR);

input [0:9] PC;
  wire [0:9] PC;
  output [127:0] B;
  reg [127:0] B;
  input M_EN_BAR;
  wire M_EN_BAR;
  input WE_BAR;
  wire WE_BAR;
  reg [0:127] imem_data [0:511];
  //reg [0:47] write_data [0:511];
  reg [0:9] pc;
  //reg [0:47] word;

// always @ (M_EN_BAR or WE_BAR or PC)
  always @ (posedge M_EN_BAR)
  begin   : Start1 if (WE_BAR) begin
         $readmemb("atesyncs.data", imem_data);
       end
     else begin
         B=imem_data [PC];
       end
  end endmodule
```

FIG. 23

```verilog
module Address_Generator (Y, X, OPT, OUT_CONT, reset, clk, D3, D4, XMAX, YMAX, XAMAX, YAMAX, D3B, D4B);
output [0:11] Y;
reg [0:11] Y;
output [0:11] X;
reg [0:11] X;
input [59:0] OPT;
wire [59:0] OPT;
input [99:92] OUT_CONT;
wire [99:92] OUT_CONT;
input reset;
wire reset;
input clk;
wire clk;
input [68:66] D3;
wire [68:66] D3;
input [71:69] D4;
wire [71:69] D4;
input [11:0] XMAX;
wire [11:0] XMAX;
input [11:0] YMAX;
wire [11:0] YMAX;
input [11:0] XAMAX;
wire [11:0] XAMAX;
input [11:0] YAMAX;
wire [11:0] YAMAX;
input [11:0] D3B;
wire [11:0] D3B;
input [11:0] D4B;
wire [11:0] D4B;
reg [11:0] yp_muxin;
reg [11:0] yc_muxin;
reg [11:0] xb_muxin;
reg [11:0] xc_muxin;
reg [11:0] xb;
reg [11:0] yb;
reg [11:0] xc;
reg [11:0] yc;
reg [11:0] xs;
reg [11:0] ys;
reg [11:0] yh;
reg [11:0] xh;
reg [11:0] xmax;

reg [11:0] xamax;
reg [11:0] ymax;
reg [11:0] yamax;
reg [11:0] xbop;
reg [11:0] ybop;
reg [11:0] xcop;
reg [11:0] yoop;
reg [11:0] xoc;
reg [11:0] yoc;
reg [11:0] xinv;
reg [11:0] yinv;
reg [11:0] xtemp;
reg [11:0] ytemp;
reg [11:0] dy;
reg [11:0] DY;
reg [11:0] dx;
reg [11:0] DX;
reg [11:0] ry;
reg [11:0] RY;
reg [11:0] rx;
reg [11:0] RX;
reg [11:0] fy;
reg [11:0] FY;
reg [11:0] fx;
reg [11:0] FX;
reg [11:0] YS;
reg [11:0] XS;
reg [11:0] xs_muxin;
reg [11:0] ys_muxin;
reg [11:0] XC;
reg [11:0] YC;
reg [11:0] d1;
reg [11:0] d2;
reg [11:0] d3;
reg [11:0] d3_muxin;
reg [11:0] d3B;
reg [11:0] d4;
reg [11:0] d4_muxin;
reg [11:0] d4B;

always @(posedge clk)
begin :Start
  if (reset) begin
    d1 = 0;
    d2 = 0;
    d3 = 0;
    d4 = 0;
    xb = 0;
    yb = 0;
    xc = 0;
    yc = 0;
    xs = 0;
    ys = 0;
    fx = 0;
    fy = 0;
    rx = 0;
    ry = 0;
    dx = 0;
    dy = 0;
    xh = 0;
    yh = 0;
    X = 0;
    Y = 0;
    xb_muxin = 0;
    xc_muxin = 0;
    xs_muxin = 0;
    yb_muxin = 0;
    yc_muxin = 0;
    ys_muxin = 0;
    d3_muxin = 0;
    d4_muxin = 0;
  end
  else begin
    xbop = OPT[27:25];
    ybop = OPT[31:28];
    xcop = OPT[11:0];
    DX = xcop[1:0];
    RX = xcop[3:2];
    FX = xcop[7:4];
    XS = xcop[9:8];
    XC = xcop[11:10];

ycop = OPT[24:12];
    DY = ycop[13:12];
    RY = ycop[15:14];
    FY = ycop[20:16];
    YS = ycop[22:21];
    YC = ycop[24:23];
    xoc = OUT_CONT[95:92];
    yoc = OUT_CONT[99:96];
    xinv = OPT[58];
    yinv = OPT[59];

xtemp = 0;
    ytemp = 0;
    xamax = XAMAX; // 2'd3;
    yamax = YAMAX; // 2'd3;
    xmax = XMAX; // 2'd3;
    ymax = YMAX; // 2'd3;
    d3B = D3B; //'1;
    d4B = D4B; //'2;

xb_muxin = xb;
    case (xbop)
      0: xb = xb;
      1: xb = xb + 1;
      2: xb = xb - 1;
      3: xb = xh;
      7: xb = 0;
    endcase

~~ OMISSION ~~ if (xinv == 1) begin
      xtemp = X;
      X = xtemp; end
      if (yinv == 1) begin
        ytemp = Y;
        Y = ytemp; end
      X = X & xmax;
      Y = Y & ymax;
    end
end
endmodule
```

FIG. 24

```
module Data_Generator (D, TP_OUT_CONT, TP_INV60, rest, clk, dflg_prev);
  output [0:7] D;
  reg [0:7] D;
  input [102:100] TP_OUT_CONT;
  wire [102:100] TP_OUT_CONT;
  input TP_INV60;
  wire TP_INV60;
  input reset;
  wire reset;
  input clk;
  wire clk;
  input dflg_prev;
  wire dflg_prev;
  reg [0:18] tph;
  reg [0:18] tp;
  reg dop;
  reg dinv;

always @(posedge clk)
  begin   :Start
      dop = TP_OUT_CONT [102:100];
      dinv = TP_INV60;
      if (reset==1) begin
         tp = 0;
         tph = 0;end
  else
      case = (dop)
         0:  tp = tp;
         1:  tp = 0;
         2:  tp = tph;
         3:  tp = tp << 2;
      endcase
      D = tp;
      if (dinv==1)
         D = ~D;
      if (dflg_prev==1)
         D = ~D;
  end
endmodule
```

TESTER ARCHITECTURE CONSTRUCTION DATA GENERATING METHOD, TESTER ARCHITECTURE CONSTRUCTING METHOD AND TEST CIRCUIT

FIELD OF THE INVENTION

The present invention relates to a so-called test circuit technology for testing a semiconductor device such as a semiconductor memory, a logic integrated circuit or the like, and to a technology for constructing a test circuit from a test program for a semiconductor device. The present invention also relates to a technology effective for application to a case in which, for example, a test circuit suitable for a semiconductor device to be tested is constructed on a variable logic circuit capable of constituting arbitrary logic.

BACKGROUND OF THE INVENTION

As a method of testing a semiconductor device such as a logic integrated circuit (hereinafter called a "logic IC") or the like, a method is normally used which generates test pattern data by a device called a tester, inputs it to a logic IC, and compares a data signal outputted from the logic IC with each expected data signal to thereby determine the result of comparison. There is also known a test technology of a BIST (Built In Self Test) type, wherein a pattern generation circuit for generating random test pattern data, like a pseudo-random number generator is built in a semiconductor device. Further, the invention related to a semiconductor memory equipped with a test circuit called an ALPG (Algorithmic Memory Pattern Generator), which is comprised of a micro-instruction type controller for generating test patterns (addresses and data) for testing a memory circuit in accordance with a predetermined algorithm and reading data written into the memory circuit, a data operation unit, and a data determining means for determining the data read from the memory circuit and outputting the result of determination, etc. and which is capable of generating a predetermined test pattern in accordance with a built-in program, has been proposed by the present inventors as the technology of testing the semiconductor memory (see International Publication WO98/47152).

FIG. 1 shows a conceptual diagram of a tester regarded as a conventional common tester. As shown in FIG. 1, a tester 100 comprises a power supply unit 110 for supplying a source voltage to a semiconductor device 200 to be tested, a driver 120 for inputting a signal to each input pin of the semiconductor device 200, a comparator 130 for comparing a signal outputted from each output pin of the semiconductor device 200 with an expected data signal, a pattern generator 140 for generating a signal sequence (so-called test patterns) inputted to the semiconductor device 200 and each expected data signal, a timing generator 150 for generating timing provided to apply each signal inputted to the semiconductor device 200, a CPU 160 used as a controller for controlling these circuits. The CPU 160 is configured so as to read a test program from an external storage device and generate and determine a testing signal (so-called test pattern) while interpreting the read test program by means of an OS (Operating System), thereby conducting a predetermined test. The tester 100 might be provided with a DC test circuit 170 for conducting a dc test such as the detection of a voltage level at each output pin.

SUMMARY OF THE INVENTION

In general, a tester is provided as a device extremely high in versatility. The tester is configured so as to have complex, high-level and large hardware to bring about its high versatility and hence becomes expensive. Namely, its reason is as follows. The tester is configured in complex form to make it possible to conduct tests on various semiconductor devices including a newly-developed versatile semiconductor device by itself and meet required various test items. The tester is also configured so as to be capable of meeting a wide range of operating frequencies and the expected maximum number of pins even as to the performance of a semiconductor device to be tested, the number of pins thereof, etc., and to have a high-level and complex construction even from the viewpoint of the performance and numerical quantity.

When a user desires to test a newly-developed semiconductor device, there may be cases in which only some proportions or percentages of functions included in a tester are used depending on the scale of the semiconductor device to be tested. As is well known, the cost of the tester is reflected on the manufacturing cost of a tested product comprised of a semiconductor chip or a semiconductor device. Thus, the very high cost of the tester is exerted or posed onto the unit price of the semiconductor chip or semiconductor device. Alternatively, when it is not possible to make its cost-up from the viewpoint of competition in the marketplace and a demand in market, a break in cost is brought about.

A test program loaded into a tester contains routines about all kinds of tests (which might extend to several hundred to several thousand of tests) necessary for one semiconductor device. The length of the test program becomes very long as a whole. Therefore, difficulties are encountered in the detection of bugs of the test program, and corrections to its test program at the detection of the bugs become cumbersome.

The conventional tester is divided into the following types or systems.

One thereof is a shared resource type wherein as shown in FIG. 2(A), clocks for giving application timings to signals produced by a timing generator 150 and generated by a pattern generator 140 are respectively distributed and supplied to a plurality of pin electronics P/E1 through P/En of a test head 190 by a distributor 180 as common timing clocks, whereby the amount of hardware for the tester is reduced. The other thereof is a per-pin test resource type wherein timing generators are provided every pin electronics P/E1 through P/En of a test head 190 as shown in FIG. 2(B). Incidentally, the pin electronics P/E1 through P/En respectively comprise drivers for applying signals to each individual input pins of a semiconductor device to be tested, connecting means, etc.

In the shared resource type tester shown in the same drawing (A), the hardware can be configured with relative ease as described above. Therefore, while it is relatively low in price, the pin electronics P/E1 through P/En each supplied with the same clock output test signals with the same timing. Thus, selection of timings is eliminated by the number of clocks. Therefore, such a shared resource type tester is reduced in the number of the clocks, and is simple in hardware and inexpensive. However, how to distribute the timing clocks must be designed, and clock re-distribution design is necessary where a change in tester occurs due to debugging, for example. A large limitation is imposed on the tester upon its use and hence the tester is hard to use. On the other hand, the per-pin type tester shown in the same drawing (B) has an advantage in that the defects of the shared resource type tester can be resolved. However, the tester is accompanied by a problem that the amount of the hardware is large and the cost thereof increases, and a time interval required for its testing becomes long because the settings of a circuit increase. Further, the shared resource type tester has a problem in that difficulties are encountered in compressing each pattern as compared with the per-pin type tester, and hence a test program becomes long.

It is thus understood that the conventional testers are very expensive and would have features to be considered, which are inherent in their types or systems regardless of their configurations expected to be highly versatile.

An object of the present invention is to provide a test circuit construction technology suitable for a semiconductor device, which is less reduced in required cost.

Another object of the present invention is to provide a test circuit construction technology simple in construction, for testing a semiconductor device.

A further object of the present invention is to provide a test method capable of selecting a test mode or system.

A still further object of the present invention is to provide a test method capable of mixing different test modes or systems.

A still further object of the present invention is to provide a test technology capable of following an improvement in performance of a semiconductor device.

A still further object of the present invention is to provide a test circuit technology capable of obtaining a test circuit in a relatively short period of time.

A still further object of the present invention is to provide a test method capable of easily constructing a tester.

A still further object of the present invention is to provide a test method capable of utilizing a tester language.

A still further object of the present invention is to provide an easy-to-debug test method.

A still further object of the present invention is to provide a test method adaptable to information communications.

The above, other objects, and novel featured of the present invention will become apparent from the description of the specification and the accompanying drawings.

Summaries of typical ones disclosed in the present application will be described as follows:

A test program related to a semiconductor device to be tested, which has been described in a tester language, is analyzed to thereby extract a test pattern generation algorithm. Further, the configuration of a test circuit (ALPG) whose function is chosen according to the contents of a test to be carried out, is determined. A description (test circuit architecture construction data) of the test circuit capable of performing tests in desired test units according to an HDL (Hardware Description Language), based on the determined configuration, is generated.

According to the above means, a test circuit such as an FPGA (Field Programmable Gate Array) or the like used as a variable logic circuit capable of constituting arbitrary logic can be constructed by using the test circuit architecture data described in HDL. Therefore, a semiconductor device to be tested can be tested using such a test circuit without having to use a commercially-available large tester. Since the most suitable test circuit can be constructed for each test contents, the amount of hardware necessary for the test circuit can greatly be reduced, whereby it can be constructed within the FPGA or the like, and the above testing can be carried out at low cost.

Since a function entry tool (e.g., "Visual Test") is offered from EDA vendor like ATE Service Inc., the description of the test circuit in HDL can be carried out with efficiency with such a tool. Incidentally, the function entry tool is a tool having the function of displaying a test circuit on the screen of a display device by use of a drawing like a block diagram, performing connections between respective blocks (called modules) and the setting of the direction of the input/output of each signal, etc. and selecting the corresponding module to input an instruction code and the contents of operation thereof, thereby automatically creating an HDL description. Since a normal tool (e.g., "Leonardo") for constructing logic within an FPGA from the HDL description of the test circuit is also offered from the EDA vendor, the test circuit can easily be constructed by use of such a tool.

Further, the creation of from a test program described in a tester language to data for constructing a test circuit (ALPG) for testing a semiconductor device to be tested within an FPGA can be carried out on a computer. Therefore, for example, a software maker receives a test program related to a semiconductor device developed by a semiconductor maker from the semiconductor maker, analyzes it to create ALPG construction data described in HDL and delivers it to the semiconductor maker. Thereafter, the semiconductor maker receives the ALPG construction data created by the software maker, and constructs an ALPG within an FPGA. Thus, the semiconductor maker is capable of testing the developed semiconductor device through the use of the ALPG without having to use an expensive tester.

BRIEF DESCRIPTION OF THE DRAWINGS

FIG. 10 is an instruction list diagram illustrating one example of a test program where a diagonal ping-pong test is carried out by an ALPG;

FIG. 14 is an instruction list diagram showing one example of a test program where a marching test is carried out by an ALPG;

FIG. 15 is an instruction list diagram showing an example of a test program described in FORTRAN where diagonal ping-pong tests are carried out by an ALPG;

FIG. 21 is a diagram showing an HDL descriptive text related to a sequence control circuit, which has been produced by the function entry tool;

FIG. 22 is a diagram illustrating an HDL descriptive text related to an instruction memory circuit, which has been generated by the function entry tool;

FIG. 23 is a diagram depicting an HDL descriptive text related to an address operation circuit, which has been generated by the function entry tool;

FIG. 24 is a diagram showing an HDL descriptive text related to a data operation circuit, which has been generated by the function entry tool;

DESCRIPTION OF THE PREFERRED EMBODIMENTS

Preferred embodiments of the present invention will hereinafter be described based on the accompanying drawings.

When a semiconductor device is newly developed, a testing engineer creates a test program.

Figure 3:
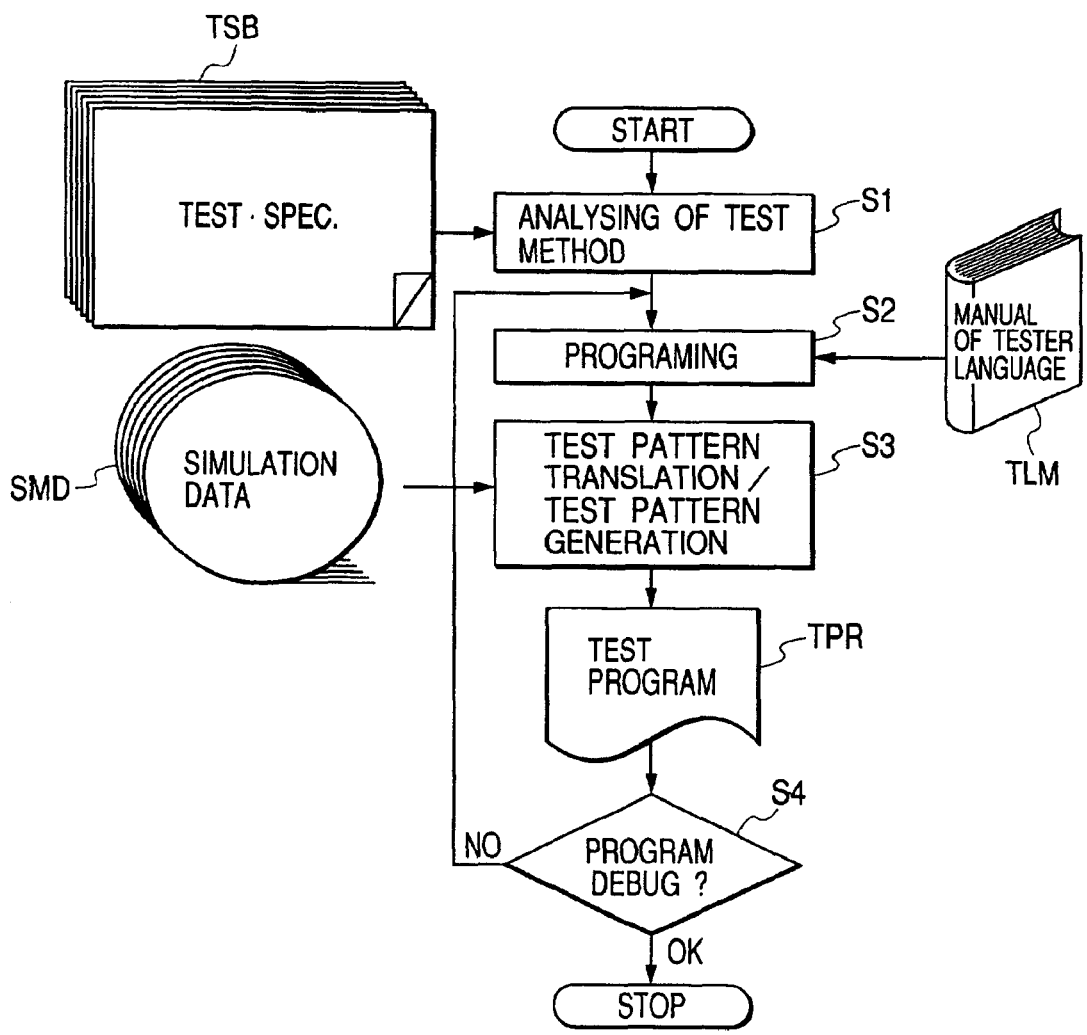
FIG. 3 is a flowchart showing the outline of a procedure of generating a test program.

As shown in FIG. 3, the testing engineer first determines a test method for the developed semiconductor device and a tester language to be used therefor by reference to a test spec. book TSB having described how many volts of signals should be applied to any pin, for example (Step S1). Next, programming is carried out according to the determined test method while referring to a manual TLM related to the determined tester language (Step S2). The tester language may be understood as the existing language generally used in the tester industry. As the tester language, may be considered, for example, a tester language created by Advanced Test Technologies Inc. In next Step S3, a test pattern used for simulation is converted into a test pattern suitable for a tester where circuit simulation data SMD exists, whereby a test program TPR including the test pattern is created. Incidentally, a tool called "TDS (Test Development Series)" provided or offered by TSSI Co., Ltd., for example, is known as a tool (support program) for converting the simulation data into a test pattern. The simulation can be carried out with efficiency through the use of such a tool.

In Step S3 referred to above, a test pattern is newly generated in the absence of the simulation data. Alternatively, if one described in another tester language in a test pattern for a similar semiconductor device already developed and subjected to testing exists, then it may be translated and generated by the TDS. The test pattern generated in Step S3 corresponds to an enumeration of data "1" and "0" inputted to pins of a semiconductor device to be tested by a test program. When it is repeatedly done, the test pattern corresponds to the least data string brought to its repetition unit. On the other hand, the programming executed in Step S2 is to generate an instruction list for giving the output order, output timing, output time, voltage level, etc. of the test pattern. When the test program is made up, the testing engineer proceeds to the following Step S4, where it is examined whether bugs are contained in the test program. If the bugs are found not to exist, it is brought to completion.

When it is desired to translate simulation data into its corresponding test pattern, the simulation data is described in such a time-driven type that all the pattern sequences are normally provided with timing information. However, since an upper limit is placed on an operating speed for a tester, the description of the test pattern for the tester takes a test rate descriptive format of a tester provided with patterns and timing information with respect to an operation rate (clock frequency) of the test pattern. Therefore, since the time-driven type simulation data does not coincide with the test rate descriptive type tester in descriptive format, the TDS has the function of accommodating the difference in format and translating the data into a pattern fit to a desired tester.

Described specifically, the TDS is configured so as to recognize the global state (how the entire circuit is kept in an operating state) of simulation data to thereby generate a test rate, gets out a test pattern from the simulation data according to its rate, and generates timing, thereby automatically generating a test rate type test pattern from the time-driven type data. If a predetermined timing is not capable of being generated with respect to an input signal due to a limit on hardware of the tester, then the TDS shows and notifies error information to an operator. A suitable test pattern generating system such as a double rate system for supplying timings through the use of different two clocks, a pin-multi system for supplying timings through the use of a plurality of pints, or the like is selected to solve problems. In regard to an output signal, an alarm about each ungenerable timing is issued to urge the operator to pay attention thereto. Further, the TDS also has the function of translating a test pattern for a different tester into a test pattern for another tester.

When the test program is completed, a test circuit is next constructed. In the present invention, however, a test circuit comprised of an ALPG for generating each test pattern used for testing a memory in accordance with a predetermined algorithm is constructed within an FPGA provided as a semiconductor device according to the following procedure. When one FPGA is no enough for the test circuit from a relationship with a logical scale of the ALPG, two or more FPGAs may be used so as to construct an ALPG according to requests. Alternatively, an FPGA is provided on the same semiconductor chip as a semiconductor device to be tested, and an ALPG may be constructed within the FPGA. The technology of providing the semiconductor device to be tested and the FPGA on the same semiconductor chip has been disclosed in the previously-proposed application (PCT/JP99/01974) or the like.

Figure 4:
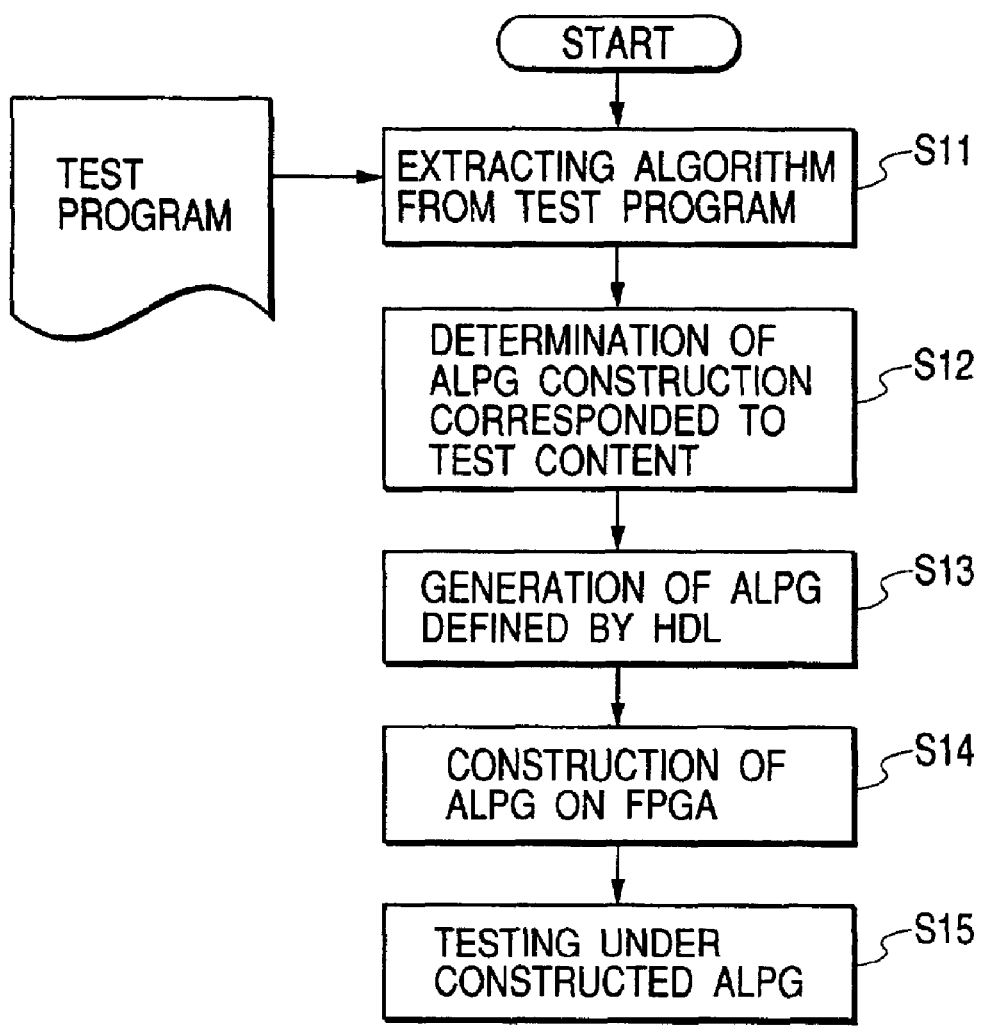
FIG. 4 is a flowchart showing one example of a procedure of constructing an ALPG for generating a test pattern from a test program within an FPGA.

FIG. 4 shows one example of a procedure for constructing an ALPG for generating a test pattern from a test program within an FPGA. Incidentally, an engineer having created the test program and an engineer who creates data for constructing the ALPG as a test circuit will be explained as persons different from each other.

First of all, a general engineer who will create ALPG construction data, is capable of analyzing a delivered test program from the delivered test program and a manual for a test language having described the test program, thereby making it possible to demonstrate the intended contents of the test program, i.e., what procedure and data should be formed. Thus, the architecture of a test circuit to be associated with the test program is recognized. Namely, the format, i.e., schematic configuration (circuit's block-diagrammatic configuration) for extracting and constructing an generation algorithm for a test pattern corresponding to a semiconductor device to be tested is determined (Step S11). An algorithm corresponding to the semiconductor device to be tested and the format (to be fixed) of an ALPG for embodying it are determined in such a manner that when the semiconductor device to be tested is a memory, for example, the format of an ALPG for generating each address and data is determined, whereas if it is of a logic LSI, then the format of an ALPG for generating input data and expected data is determined. The general testing engineer is capable of recognizing a test operation from the test program described in tester language and the tester language manual even if a tester's circuit diagram is not prepared, and recognizing the architecture of the tester from the test operation. It is therefore possible to determine the format of the ALPG (test circuit) for the semiconductor device to be tested from the test program.

Next, the completed test program is analyzed and disassembled into the minimum test units. Necessary functions are chosen every unit tests to thereby determine the architecture (configuration) of the most suitable or optimum ALPG, i.e., the components thereof and their connection relations or the like (Step S12). In this case, components required to execute all the tests described in the test program are first determined, and components unnecessary for the execution of the test to be noticed may be deleted from the determined components.

Next, the ALPG having the determined architecture is described in HDL (Hardware Description Language) (Step S13). The testing engineer may manually perform the description of the ALPG by the HDL. However, since a function entry tool called "Visual Test" is offered from ATE Service Co., Ltd., for example, the description thereof can be done through the use of it.

Thereafter, an FPGA and a semiconductor device to be tested are placed on one board by use of data described in HDL, and tests on them are conducted (Step s15). As has been disclosed in the application (PCT/JP99/01974) previously proposed by the present inventors, the FPGA may be built in a logic LSI to be tested. In a logic LSI with an FPGA built therein, an ALPG is constructed in an in-chip FPGA from the HDL description, and a test on an in-chip logical portion may be conducted by the ALPG. If, in this case, one test based on the constructed ALPG is finished, then an ALPG suitable for the execution of another test is reconstructed within the FPGA and testing may be done again.

Since a one-chip LSI (Model number: EPF10K130E) having a 130K-gate scale is offered for an FPGA capable of constituting arbitrary logic from Altera Corporation, for example, an ALPG can be constructed by use of it. Since "MAX+plus11" offered from Altera Corporation, for example, is known as a support tool for constituting logic within an FPGA from the HDL description, such a construction as described above can automatically be carried out by a computer through the use of the tool.

As a result of discussion by the present inventors, it was found that such a memory ALPG as to be described later, which generates a memory's test pattern, for example, could be constructed of ten thousand or less in terms of the number of logic gates. Therefore, the construction of the ALPG within the FPGA is fully allowed.

On the other hand, one who offers the tester based on the above-described method, may provide the FPGA with the above ALPG constructed therein for a user intended to make a test on a semiconductor device. Alternatively, the offerer may provide the test circuit architecture construction data generated in Step S13 of FIG. 4 and described in HDL. In such a case, the test circuit architecture construction data is offered in the form of a storage medium or transmission medium. One who has accepted the test circuit architecture construction data, constructs a test circuit within, for example, an FPGA from the offered HDL through the use of a computer.

Figure 5:
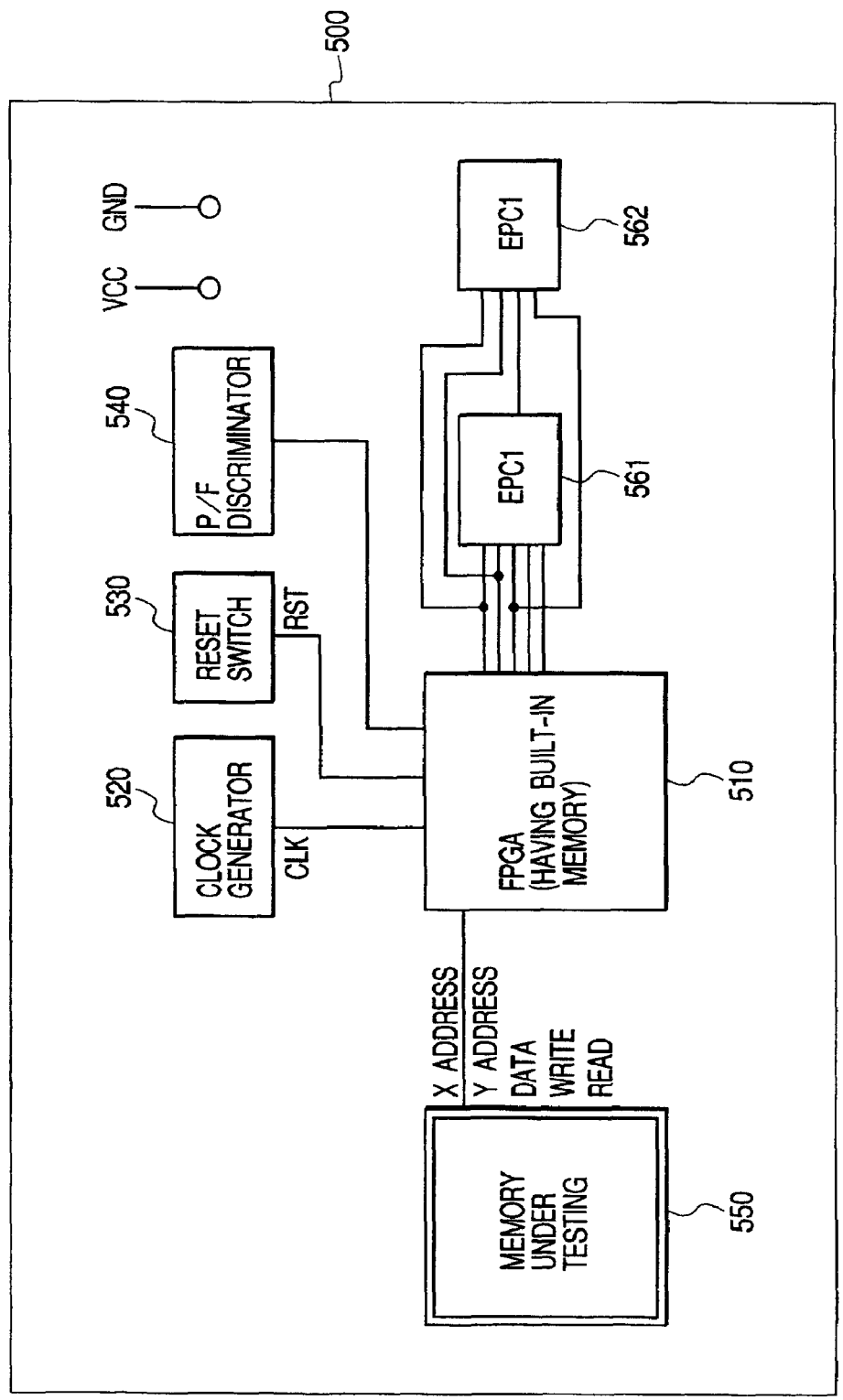
FIG. 5 is a flowchart illustrating one example of a procedure of constructing the ALPG within the FPGA.

FIG. 5 shows a configuration example of a test board having an FPGA in which an ALPG is constructed therein-side by the tool, and a memory using the FPGA.

In FIG. 5, reference numeral 510 indicates an FPGA having an ALPG constructed thereinside. The FPGA is equipped with a memory circuit thereinside. In the present embodiment, the internal memory circuit is utilized as an instruction memory which stores therein a microprogram comprised of a plurality of microinstruction groups described in accordance with a predetermined test pattern generation algorithm. Reference numeral 520 indicates a clock generator which generates a clock signal CLK required to operate the FPGA 510, reference numeral 530 indicates a reset switch which generates a reset signal RST when the FPGA 510 is manually reset, reference numeral 540 indicates a discriminator which compares an expected data generated by the FPGA 510 with data outputted from a memory-under-testing LSI 550 intended for testing under the FPGA and discriminates whether the data is indefective or defective, respectively. These circuits are placed on one board 500 like a printed circuit board and constitute a tester.

In FIG. 5, reference numerals 561 and 562 indicate devices for generating data for constituting desired logic within the FPGA 510. The FPGA has such a configuration that variable logic circuits each capable of constituting arbitrary logic, and variable switch arrays each capable of connecting between the adjacent arbitrary variable logic circuits through wirings are alternately laid out. Data for determining the logic of each variable logic circuit lying within the FPGA, and data for setting each switch to be brought into conduction within each variable switch array are stored in each of the devices 561 and 562, whereby desired logic is constituted within the FPGA.

Incidentally, a socket electrically connected to the FPGA through printed wirings is provided on the board 500 although not restricted in particular in the test board shown in FIG. 5. The LSI 550 to be tested is inserted into the socket and is hence capable of operation in response to a signal outputted from the FPGA.

A specific example of a memory test circuit constructed based on the test circuit architecture construction data generated by the method will be explained with a memory test circuit for testing a semiconductor memory (DRAM) as one example.

Figure 6:
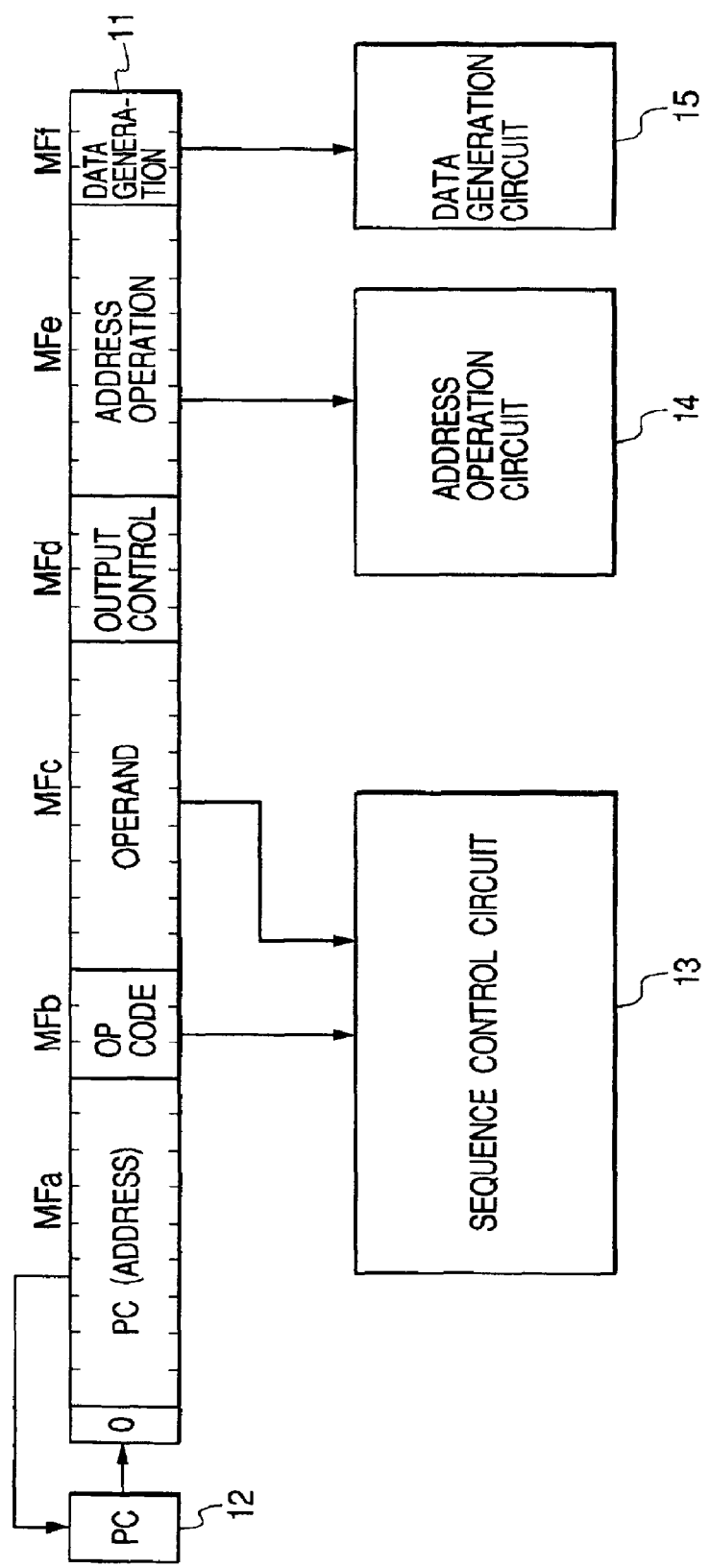
FIG. 6 is a block diagram showing a schematic configuration of an ALPG for generating a test pattern used for testing each memory in accordance with a predetermined algorithm.

FIG. 6 shows a schematic configuration of an ALPG for generating each test pattern for testing each of memories in accordance with a predetermined algorithm. The ALPG according to the present embodiment comprises an instruction memory 11 in which a microprogram comprised of a plurality of microinstruction groups described in a test pattern generation algorithm is stored, a program counter 12 for specifying a microinstruction to be read from the instruction memory 11, a sequence control circuit 13 for decoding an instruction code lying within the microinstruction read from the instruction memory 11 to form a control signal for a memory circuit and control signals for functional blocks constituting the ALPG such as the program counter 12, etc., an address operation circuit 14 for generating a test address in accordance with the microinstruction read from the instruction memory 11, a test data generation circuit 15 for generating test data and expected data in accordance with the read microinstruction, etc.

Incidentally, means for comparing data read from a memory circuit to be tested and data written therein and determining whether they coincide with each other is needed to make a decision as to whether the memory circuit is normal. Therefore, it is well possible to provide even such a comparison determination circuit within the ALPG. However, the comparison determination circuit may be configured by an external computer. Thus, in the present embodiment, the external computer is configured so as to have such a comparison determining function to make an easy understanding. The ALPG according to the present embodiment will be explained with no comparison determining function included therein.

As shown in FIG. 6, the microinstruction stored in the instruction memory 11 comprises an address filed MFa in which PC addresses each indicative of an instruction jump address used in a jump instruction are stored, an OP code filed MFb in which sequence control codes are stored, an operand field MFc in which the number of instruction's repetitions, etc. are stored, a control field MFd in which control codes for specifying the output and read/write of addresses and data are stored, an address operation code field MFe in which address operation instruction codes are stored, a data generation instruction code field MFf in which data generation instruction codes are stored, etc.

Figure 7:
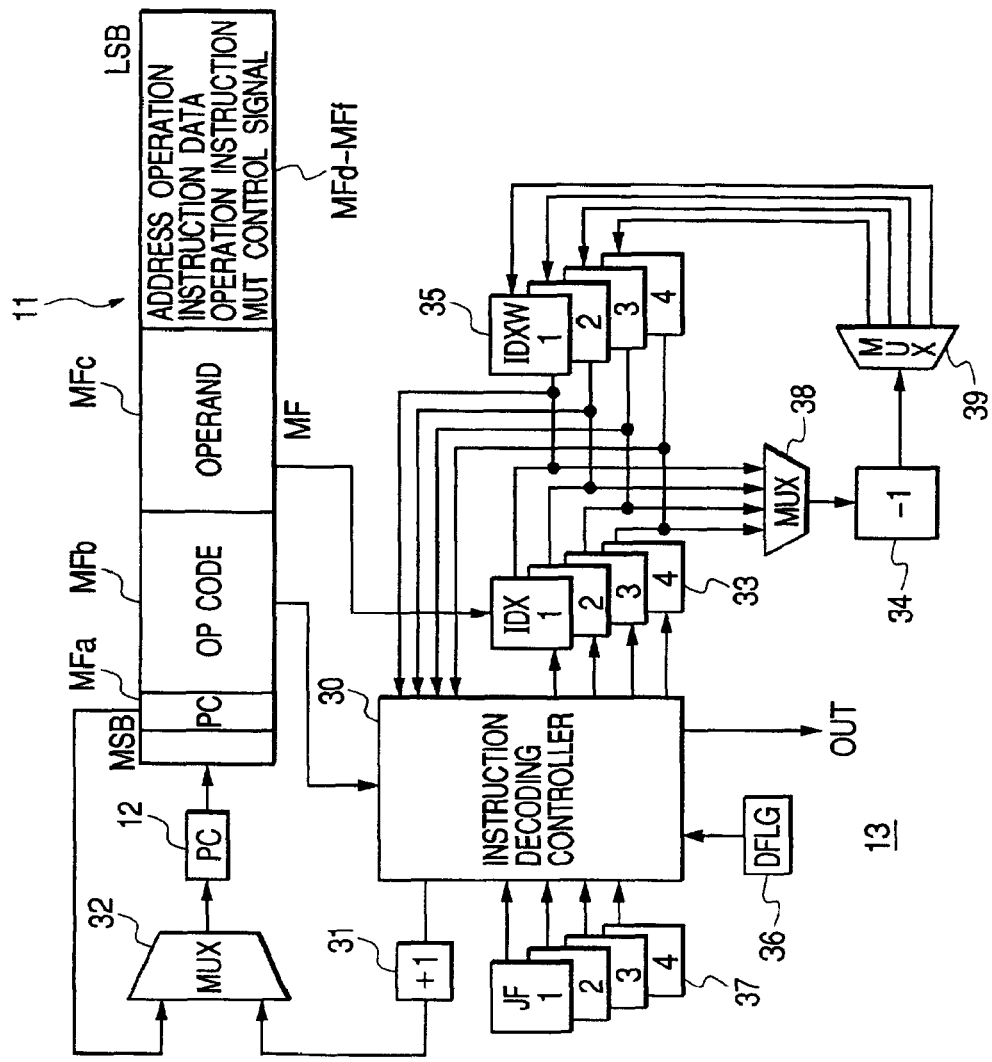
FIG. 7 is a block diagram illustrating a configuration example of a sequence control circuit of the ALPG shown in FIG. 6.

FIG. 7 shows a configuration example of the sequence control circuit 13. The sequence control circuit 13 comprises an instruction decoding controller 30 comprised of a decoder which decodes a control code in an op code field MFb to thereby form a control signal, etc., an incrementer 31 for incrementing the value of a program counter 12 by "+1", a multiplexer 32 for selecting any of jump addresses lying within the incrementer 31 or an address field MFa and supplying it to the program counter 12, an index register 33 for holding the number of repetitions lying within the operand field MFc, a decrementer 34 for decrementing the value of the corresponding index register 33 by "−1", a working register 35 for holding each value decremented by "−1", a flag 36 indicative of the presence or absence of data inversion used in JDX instructions (see Table 1) to be described later, a flag 37 indicative of the presence or absence of the transfer of each operand used in each JNI instruction to the program counter 12, a multiplexer 38 for selectively supplying the values of the registers 33 and 35 to the decrementer 34, a demultiplexer 39 for distributing the value of the decrementer 34 to any plane of the working register 35, etc.

Table 1 shows the types of op codes stored in the op code field MFb in the microinstruction and used in the sequence control and the contents thereof.

TABLE 1

| Command | Operation |
|---------|-----------|
| NOP | PC+1→PC |
| JNI1 | JNIn(n=1~4) operand |
|  | JFn=0 operand→PC |
| JNI2 | IDXn →IDX |
|  | IDX →IDXWn |
| JNI3 | 1 →JFn |
|  | JFn=1 IDXWn=0 PC+1 →PC |
| JNI4 | 0 →JFn |
|  | IDXwn≠0 operand→PC |
|  | IDXWn →IDX |
|  | IDX−1 →IDXWn |
| JZD | JZD operand |
|  | DFLG=0 operand→PC |
|  | 1→DFLG |
|  | DFLG≠0 PC+1 →PC |
|  | 0→DFLG |
| JMP | JMP operand |
|  | operand→PC |
| STOP | STOP |

In Table 1, an instruction indicated by "NOP" is a non-operation instruction for causing the incrementer 31 to increment the value of the program counter 12 by "+1" and returning it to the program counter 12, i.e., an instruction for specifying a shift to the next instruction without executing any operation except for the updating of the program counter.

Further, "JNI1" through "JNI4" are instructions prepared to pass a loop of jump-based instructions. There may be cases in which upon a memory's pattern test, the number of instructions can be reduced by repeatedly executing the same instruction any number of times through the use of each jump instruction (e.g., there may be cases in which addresses are incremented up to the final address and thereby "1" is written into all the memory cells and read therefrom.). In the present embodiment, the index register 33 is provided to allow the setting of the number of times that the loop is passed (the number of jumps). Further, the jump instruction, the index register 33 and the working register 35 are respectively provided four by four to allow the execution of a plurality of types of determination modes or methods.

Since the respective jump instructions are identical in control contents to one another, the control operation based on "JNI1" will be explained below and others will therefore be omitted.

When the JUNI1 instruction is read from the op code field MFb, it is determined whether it is of the first or initial JNI1 instruction. The result of determination thereof is reflected on the corresponding flag 37. Described specifically, when the first JNI1 is determined, the flag JF1=0, and JF1=1 when the second and subsequent instructions are determined.

When the JNI1 instruction is read at the flag JF1=0, the multiplexer 32 is controlled so that the corresponding PC address lying within the address field MFa of the microinstruction is set to the program counter 12, whereby the microinstruction is jumped to its corresponding address, and the flag JF1 is set to "1". Simultaneously with it, the number of times that the loop is passed, in the operand field MFc, is read into the corresponding IDX1 of the index registers 33.

When the JNI1 instruction is read at the flag JF1=1, the corresponding PC address lying within the address field MFa of the microinstruction is set to the program counter 12, and the number of times that the loop is passed, in the IDX1 of the index registers 33, is supplied to the decrementer 34 through the multiplexer 38, where it is decremented by "−1", followed by storage into the corresponding IDXW1 of the working registers 35 through the demultiplexer 39. When the IDXW1 thereof is brought to "0", the multiplexer 32 is controlled in such a manner that an address of the program counter 12 is incremented by "+1" by use of the incrementer 31 alternatively without setting the PC address lying within the address field MFa of the microinstruction to the program counter 12, followed by feedback to the program counter 12.

Thus, when the JNI instruction is stored in the op code field MFb of the microinstruction, and the PC address of the corresponding microinstruction is stored in the address field MFa, the same JNI instruction is executed by the number of times in the operand field MFc and the loop is repeated. Finally, such control that the program counter 12 is incremented and proceeds to the next microinstruction, followed by escaping from the loop, is carried out.

"JZD" in Table 1 is an instruction for specifying that the value of the corresponding IDX of the index registers 33 is decremented by "−1", followed by input to its corresponding IDXW of the working registers 35, and when DFLG in the flags 37 is "0", an operand is transferred to the program counter from which its address data is jumped to an instruction for a jump address indicated by the operand, and the DFLG flag is set to "1", whereas when the DFLG flag is "1", the value of the program counter is incremented, and the incremented value is returned to the program counter and the DFLG flag is reset to "0".

Further, "JMP" is an instruction for specifying that an operand is transferred to the program counter from which its address data is jumped to an instruction for a jump address indicated by the operand. "STOP" is a stop or halt instruction for ending sequence control.

Figure 8:
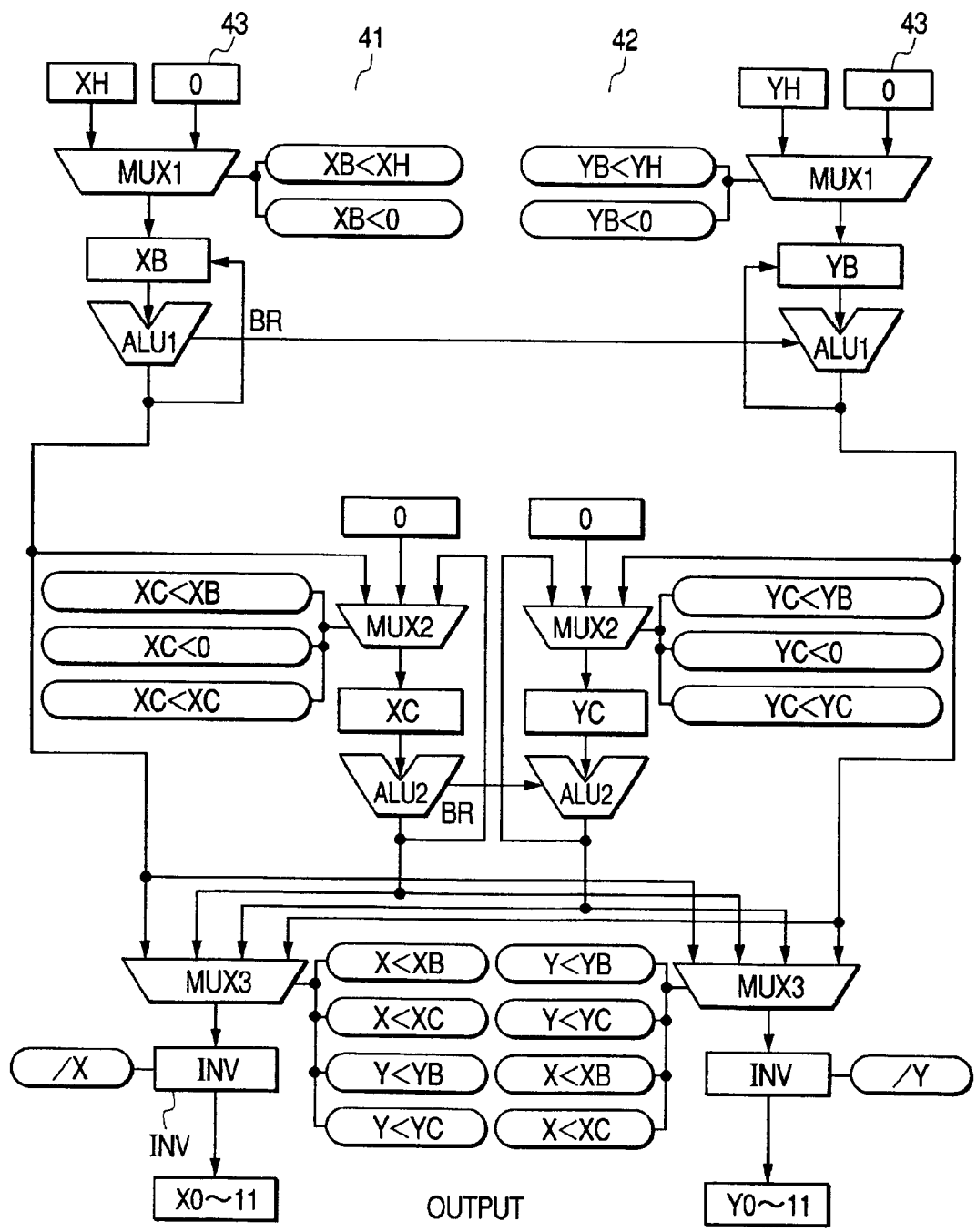
FIG. 8 is a block diagram depicting a configuration example of an address operation circuit of the ALPG shown in FIG. 6.

FIG. 8 shows a configuration example of the address operation circuit 14. The address operation circuit 14 comprises, in parts largely, an X address operation portion 41 for generating an X address, and a Y address operation portion 42 for generating a Y address. Since the X address operation portion 41 and the Y address operation portion 42 are substantially identical to each other in configuration, the configuration of the X address operation portion 41 will be explained below, and the description of the configuration of the address operation portion 42 will therefore be omitted. Further, an additional Z address operation portion can be provided as needed so as to generate partial patterns.

The X address operation portion 41 comprises an initial value register XH for storing an initial value of an X address therein, a zero setting means 43 for holding "0" therein, a multiplexer MUX1 for selecting either the initial value of the X address or "0, a base register XB for holing the selected initial value or "0", a first arithmetic logic unit ALU1 for adding the value of a register XB, a second multiplexer MUX2 for selecting either the result of operation by the arithmetic logic unit ALU1, "0" or a feedback value, a current register XC for holding the selected value therein, a second arithmetic logic unit ALU2 for performing addition or subtraction of the value of the register XC, a third multiplexer MUX3 for selecting either the output of the second arithmetic logic unit ALU2 or the output of the first arithmetic logic unit ALU1, and an inverter INV capable of inverting the selected output. The inverter INV is provided because there may be a case in which a test on a malfunction caused by switch noise of an address signal is carried out upon a memory's pattern test, and it is necessary to output an inverted signal of the address signal at this time. Using such an inverter makes it possible to easily form the inverted signal of the address upon such a test.

In the present embodiment, although not restricted in particular, the third multiplexers MUX 3 are respectively configured in such a manner that the X addresses produced in the arithmetic logic units ALU1 and ALU2 of the X address operation portion 41 can be outputted to the Y address side, and the Y addresses generated by the Y address operation portion 42 can be outputted to the X address side. Thus, they are configured so as to be capable of being used as any test circuits for a plurality of types of memories, e.g., address multiplex type memories, and address non-multiplex type memories. Namely, the simple rewriting of the microinstruction stored in the instruction memory 11 makes it possible to generate test patterns necessary for a plurality of memories different in spec from one another with respect to the plurality of memories and carry out testing.

Incidentally, the X address operation portion 41 and the Y address operation portion 42 are different from each other in that when the first arithmetic logic unit ALU1 of the X address operation portion 41 overflows, a borrow signal BR is supplied to the first arithmetic logic unit ALU1 of the Y address operation portion 42.

Table 2 shows the types of operation codes stored in the op code field MFe of the microinstruction and used in Y address arithmetic operations (base operations) of the first arithmetic logic unit ALU1 of the Y address operation portion 42.

TABLE 2

| YB arithmetic operation | Operation |
|---|---|
| YB<YB | Non Operation |
| YB<0 | 0→YB |
| YB<YH | YH→YB |
| YB<YB+1 | YB+1→YB |
| YB<YB−1 | YB−1→YB |
| YB<YB+1^BX | XB≠XMAX YB→YB |
|  | XB=XMAX YB+1→YB |
| YB<YB−1^BX | XB≠XMAX YB→YB |
|  | XB=XMAX YB−1→YB |
| YB<YB+1+BX | XB≠XMAX YB+1→YB |
|  | XB=XMAX YB+2→YB |
| YB<YB−1−BX | XB≠XMAX YB−1→YB |
|  | XB=XMAX YB−2→YB |

In Table 2, YB<YB indicates a non operation instruction free of any operation, YB<0 indicates an instruction for setting the value of a base register YB to "0", YB<YH indicates an instruction for registering the contents of an initial value register YH in the base register YB, YB<YB+1 indicates an instruction for incrementing the value of the base register YB by (+1) and feeding back it to the register YB, YB<YB−1 indicates an instruction for decrementing the value of the base register YB by (−1) and returning it to the register YB, YB<YB+1^BX indicates an instruction for holding the value of the base register YB as it is if the value of the base register XB is not given as the maximum value and incrementing the value of the base register YB if the value of the base register XB is given as the maximum value, and returning the incremented value to the register YB, YB<YB+1+BX indicates an instruction for incrementing the value of the base register YB by (+1) if the value of the base register XB is not given as the maximum value and returning it to the register YB, and double-incrementing the value of the base register YB by (+2) if the value of the base register XB is given as the maximum value and returning it to the register YB, and YB<YB−1−BX indicates an instruction for decrementing the value of the base register YB by (−1) if the value of the base register XB is not given as the maximum value and returning it to the base register YB, and double-decrementing the value of the base register YB by (−2) if the value of the base register XB is given as the maximum value and returning it to the base register YB, respectively.

Table 3 indicates the types of operation codes used in address operations or arithmetic operations by the first arithmetic logic unit ALU1 of the X address operation portion 41, and the contents thereof. Table 4 indicates the types of operation codes used in Y address operations or arithmetic operations (current operations) by the second arithmetic logic unit ALU2 of the Y address operation portion 42, and the contents thereof. Table 5 indicates the types of operation codes used in address operations or arithmetic operations by the second arithmetic logic unit ALU2 of the X address operation portion 41, and contents thereof.

TABLE 3

| XB arithmetic operation | Operation |
| --- | --- |
| XB<XB | Non Operation |
| XB<0 | 0→XB |
| XB<XH | XH→XB |
| XB<XB+1 | XB+1→XB |
| XB<XB−1 | XB−1→XB |

TABLE 4

| YC arithmetic operation | Operation |
| --- | --- |
| YC<YC | Non Operation |
| YC<YB | YB→YC |
| YC<0 | 0→YC |
| YC<YC+1 | YC+1→YC |
| YC<YB+1 | YB+1→YC |
| YC<YC−1 | YC−1→YC |
| YC<YB−1 | YB−1→YC |
| YC<YC+1+BX | XB≠XMAX YC+1→YC, XB=XMAX YC+2→YC |
| YC<YB+1+BX | XB≠XMAX YB+1→YC, XB=XMAX YB+2→YC |
| YC<YC−1−BX | XB≠XMAX YC−1→YC, XB=XMAX YC−2→YC |
| YC<YB−1−BX | XB≠XMAX YB−1→YC, XB=XMAX YB−2→YC |
| YC<YC+1+CY | XC≠XMAX YC+1→YC, XC=XMAX YC+2→YC |
| YC<YB+1+CY | XC≠XMAX YB+1→YC, XC=XMAX YB+2→YC |
| YC<YC−1−CY | XC≠XMAX YC−1→YC, XC=XMAX YC−2→YC |
| YC<YB−1−CY | XC≠XMAX YB−1→YC, XC=XMAX YB−2→YC |
| YC<YC+1^BX | XB≠XMAX YC→YC, XB=XMAX YC+1→YC |
| YC<YB+1^BX | XB≠XMAX YB→YC, XB=XMAX YB+1→YC |
| YC<YC−1^BX | XB≠XMAX YC→YC, XB=XMAX YC−1→YC |
| YC<YB−1^BX | XB≠XMAX YB→YC, XB=XMAX YB−1→YC |
| YC<YC+1^CY | XC≠XMAX YC→YC, XC=XMAX YC+1→YC |
| YC<YB+1^CY | XC≠XMAX YB→YC, XC=XMAX YB+1→YC |
| YC<YC−1^CY | XC≠XMAX YC→YC, XC=XMAX YC−1→YC |
| YC<YB−1^CY | XC≠XMAX YB→YC, XC=XMAX YB−1→YC |

TABLE 5

| XC arithmetic operation | Operation |
| --- | --- |
| XC<XC | Non Operation |
| XC<XB | XB→XC |
| XC<0 | 0→XC |
| XC<XC+1 | XC+1→XC |
| XC<XB+1 | XB+1→XC |
| XC<XC−1 | XC−1→XC |
| XC<XB−1 | XB−1→XC |

Further, symbols X<XB, X<XC, Y<YB, and Y<YC respectively indicate instructions for outputting the values of the registers XB, XC, YB and YC, and /X and /Y respectively indicate instructions for inverting the outputs by the inverters INV.

Figure 9:
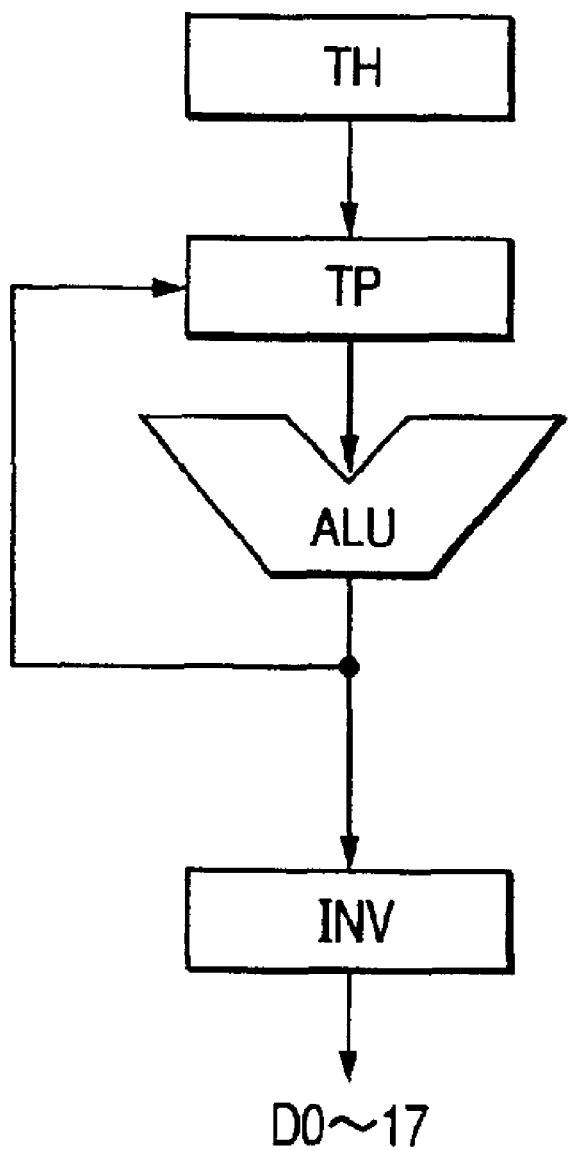
FIG. 9 is a block diagram showing a configuration example of a data operation circuit of the ALPG shown in FIG. 6.

FIG. 9 shows an example of a configuration of the test data generation circuit 15. The test data generation circuit 15 employed in the present embodiment comprises an initial value register TH for storing an initial value of write data therein, a base data register TP for holding the initial value (or the result of arithmetic logic unit ALU) as reference data for test data to be outputted, an arithmetic logic unit ALU having a bit shift function, and an inverter INVERT capable of inverting the output of the arithmetic logic unit ALU.

Table 6 shows the types of control codes stored in the data generation code field MFf in the microinstruction and used for operation control on the test data generation circuit 15, and the contents thereof. In Table 6, TP<TP indicates a non operation instruction free of any operation, TP<0 indicates an instruction for setting the value of a register TP to "0", TP<TPH indicates an instruction for registering the contents of an initial value register TH in the register TP, /D indicates an instruction for inverting the value of the register TP and outputting the inverted value, and TP<TP*2 indicates an instruction for controlling the register TP and the arithmetic logic unit ALU to process 18-bit data lying within the register TP with the arithmetic logic unit ALU and shift a bit string to the MSB side or LSB side by one bit, followed by return to the register TP. Owing to such an instruction, test data for writing data "1" to each memory cell by one bit can be generated with relative ease even if a memory portion is a memory of such a type that data is read therefrom and written therein in one-word or one-byte units.

TABLE 6

| TP output | Operation |
| --- | --- |
| TP<TP | Non Operation |
| TP<0 | 0→TP |
| TP<TPH | TPH→TP |
| TP<TP*2 | Shift left |
| /D | /TP→TP |

FIG. 10 shows an instruction list of a test program where such diagonal ping-pong tests as shown in FIG. 11 are carried out by the ALPG having such a configuration as shown in FIGS. 6 through 9. The diagonal ping-pong tests are tests for detecting or determining whether storage data corresponding to bits noticed according to the operation of reading of other diagonally-placed bits change.

In the instruction list shown in FIG. 10, a first line indicates a declaration statement indicative of the contents of a text, "REGISTER" corresponding to a second line to "D3B=#1" corresponding to a ninth line indicate instructions for setting predetermined values of a register, such as an upper-limit value corresponding to memory capacity of a memory to be tested, etc., "PC=#000" corresponding to a tenth line indicates an instruction for setting the value of the program counter to "000", an eleventh line indicates a start instruction, and a twelfth line indicates an instruction for setting the initial values of the registers XB, YB and TP in the operation portion without executing any operation in the sequence control circuit 13.

Figure 11A:
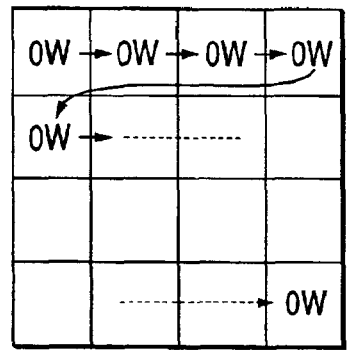
FIG. 11 is a diagram for describing a procedure of performing each diagonal ping-pong test.
Figure 11D:
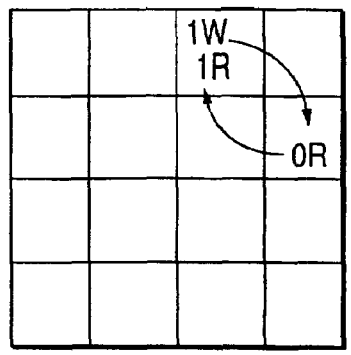
Figure 11B:
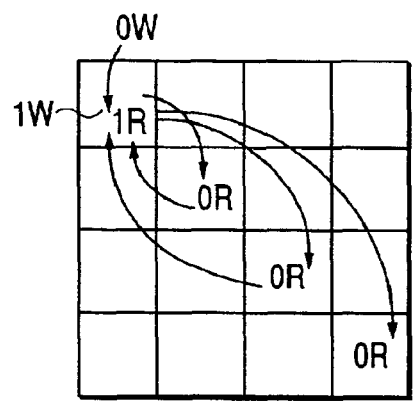
Figure 11E:
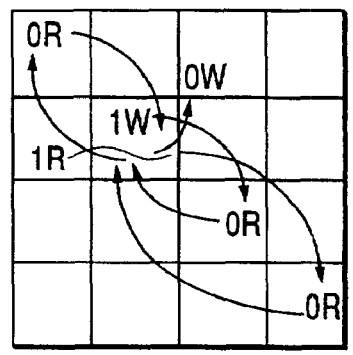
Figure 11C:
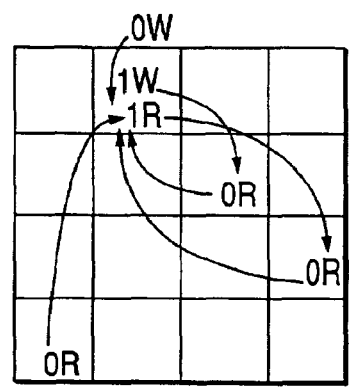
Figure 11F:
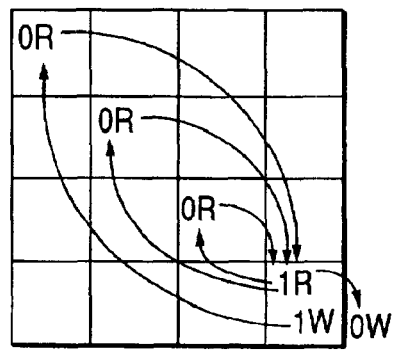

Further, instructions of Steps ST1 through ST4 corresponding to thirteenth through twentieth lines indicate combined ones of the instructions shown in Tables 1 through 6. Owing to the successive execution of these, such addresses and data that the operation of writing "0" into all bits of a memory array as shown in FIG. 11(a), thereafter successively writing "1" from the leading bits of the memory array as shown in FIGS. 11(b) through 11(f), reading "0" from other diagonally-placed bits, making a return to the original bits again, and reading "1", is repeatedly carried out, are generated and outputted by the ALPG. Incidentally, although not shown in Tables 1 through 6, D3 and D3B in the list means registers for storing the amount of addition of each address as in the case of "+2" and "+3". D3<D3B indicates an instruction for registering the value of the register D3B into D3, and XC<XB+D3 indicates an instruction for adding the value of D3B to the value of the register XB and inputting the result of addition to the register XC. YC<YB+D3 and the like are also similar to the above. Further, "W" and "R" indicate codes indicative of writing and reading, stored in the control field MFd of the instruction code, and STOP indicates a halt instruction.

Figure 12:
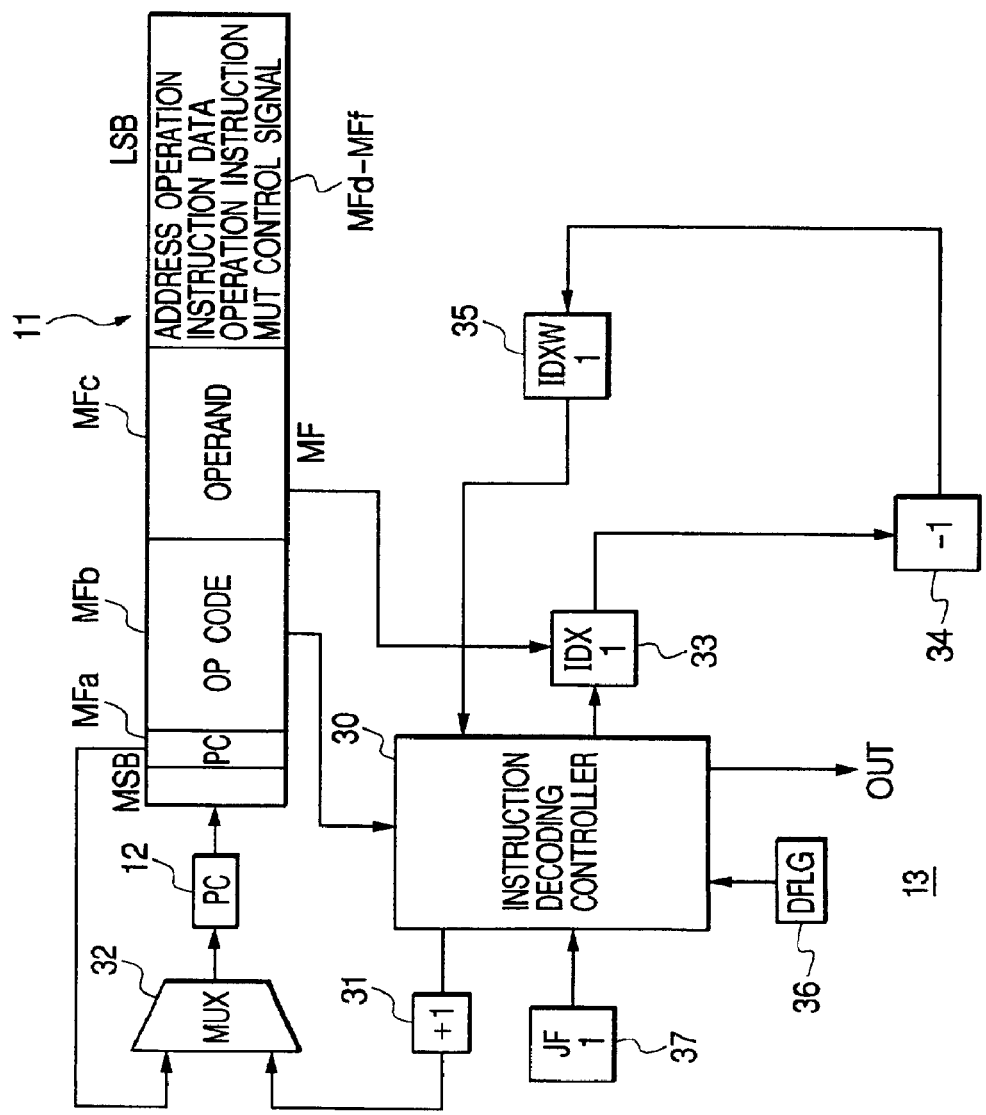
FIG. 12 is a block diagram showing a configuration example of a sequence control circuit of another ALPG for memory testing.
Figure 13:
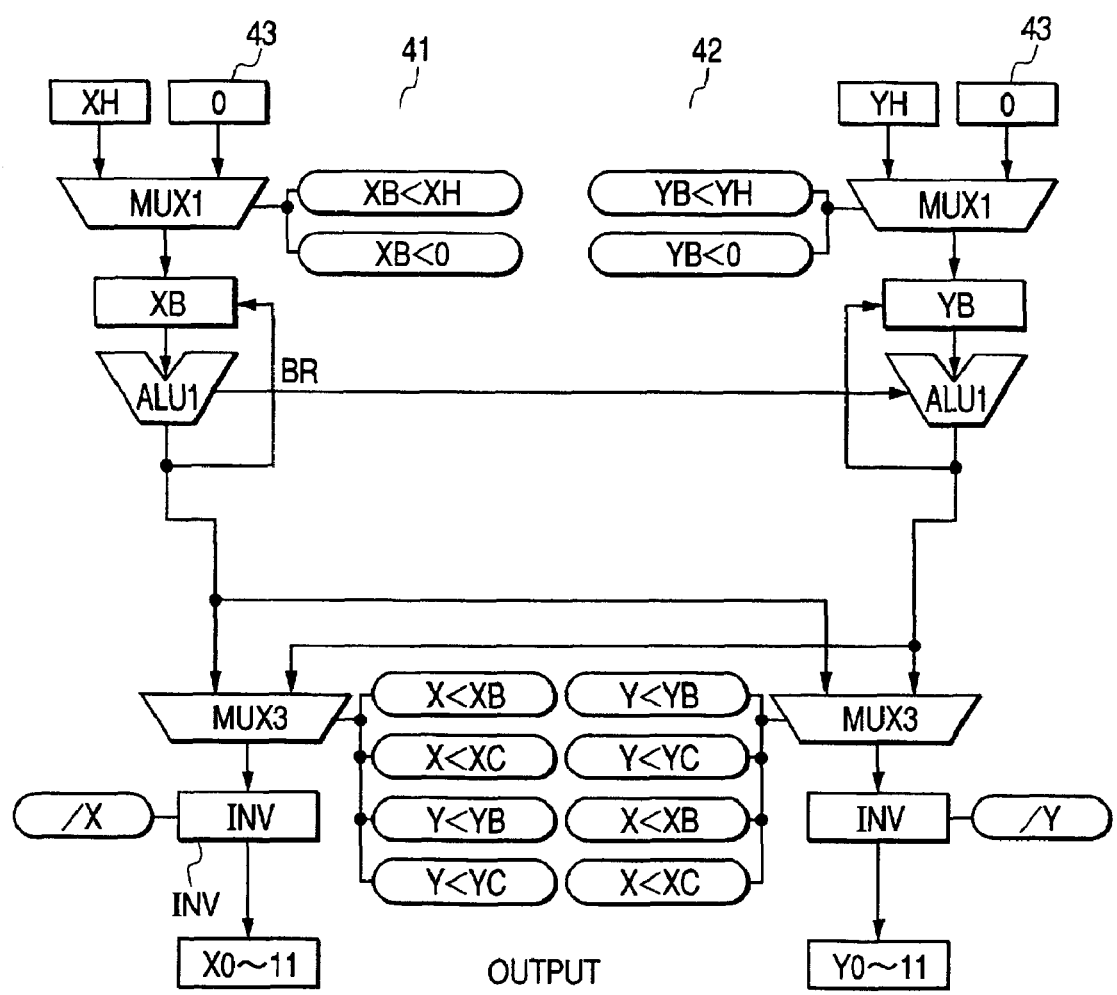
FIG. 13 is a block diagram illustrating a configuration example of an address operation circuit of another ALPG for memory testing.

FIGS. 12 and 13 respectively show configurations of a sequence control circuit and an address operation portion of an ALPG where a marching test corresponding to one memory test is carried out. The whole configuration of the ALPG and the configuration of a data operation circuit are identical to those in the first embodiment (FIGS. 6 and 9).

Upon the marching test, all the bits for the memory cells in the memory array are selected in turn. Data of "0" is written into the selected memory cells, and thereafter the written data of "0" are read. Subsequently, all the bits are selected in turn. Data of "1" is written into the selected memory cells, and thereafter the written data of "1" are read. They are respectively compared with expected data to determine the presence or absence of defects.

The ALPG employed in the present embodiment and the ALPG shown in FIGS. 6 through 9 are different from each other in that the index register 33, the working register 35, the flag 37 indicative of the presence or absence of the transfer of an operand used in a JNI instruction to a program counter 12 may be one in the sequence control circuit 13 without the need for four, and a demultiplexer 38 for distributing the value of the index register 33 to any plane of decrementers 34, and a demultiplexer 39 for distributing the value of the decrementer 34 to any plane of working registers 35 are omitted.

In the operation portion as shown in FIG. 13, it is not necessary to provide a second multiplexer MUX2 for selecting either the result of operation by an arithmetic logic unit ALU1 of an X address operation portion 41, "0" or a feedback value, a current register XC for holding the selected value, and a second arithmetic logic unit ALU2 for performing addition or subtraction of the value of the register XC. It is also unnecessary to provide a second multiplexer MUX2 for selecting either the result of operation by an arithmetic logic unit ALU1 of a Y address operation portion 42, "0" or a feedback value, a current register YC for holding the selected value, and a second arithmetic logic unit ALU2 for performing addition or subtraction of the value of the register YC. Since this can easily be recognized from the analysis of a test program, the amount of hardware can be reduced by constructing the ALPG having only the configuration necessary for the test to be executed as described above, and hence a compact ALPG can be implemented.

FIG. 14 shows a list of a microinstruction for executing a marching test. Steps ST1 through ST3 of the instruction list also comprise combinations of the instructions shown in Tables 1 through 6.

With the execution of the instruction list shown in FIG. 14, the ALPG produces addresses and data in such a manner that all the bits for the memory cells in the memory array are selected in turn and data of "0" is written into the selected memory cells, followed by reading of the written data of "0", and subsequently, all the bits are selected in turn and data of "1" is written into the selected memory cells, followed by reading the written data of "1".

Two tests or the diagonal ping-pong and marching tests have been described above specifically. In addition to the above tests, however, an all "0" determination test or an all "1" determination test for detecting whether "0" or "1" can be written into all the memory cells, a so-called square-of-N pattern test (or galloping test) for carrying out tests on all the bits, as to whether "1" is written into a given bit and thereby miswritten into other bits, etc. might also be performed. However, the present invention is applied to thereby make it possible to construct and test or inspect a test circuit having the minimum configuration necessary for their tests.

While the above embodiment has described the case in which the ALPG is described in HDL, the ALPG can be described in computer-understandable languages such as FORTRAN, C language, etc. as well as in HDL. FIG. 15 shows an example in which an instruction list with respect to a sequence control circuit at the time that diagonal ping-pong tests are carried out, is described in FORTRAN. Similarly, instruction lists with respect to an address operation portion and a data operation portion can also be described in FORTRAN.

A description will next be made of a specific procedure for generating ALPG construction data in Step S13 of FIG. 4 through the use of a function entry tool while referring to FIGS. 16 through 23.

The function entry tool employed in the present embodiment has the function of displaying drawings like circuit block diagrams on the screen of a display device as shown in FIGS. 16 through 20, connecting between input/output signals for respective blocks (hereinafter called "modules") and the modules, and automatically creating such HDL descriptive texts as shown in FIGS. 21 through 23 when each module is selected and an instruction code, the contents of operation, etc. are inputted via a keyboard. The details of the function will be explained below.

Figure 16:
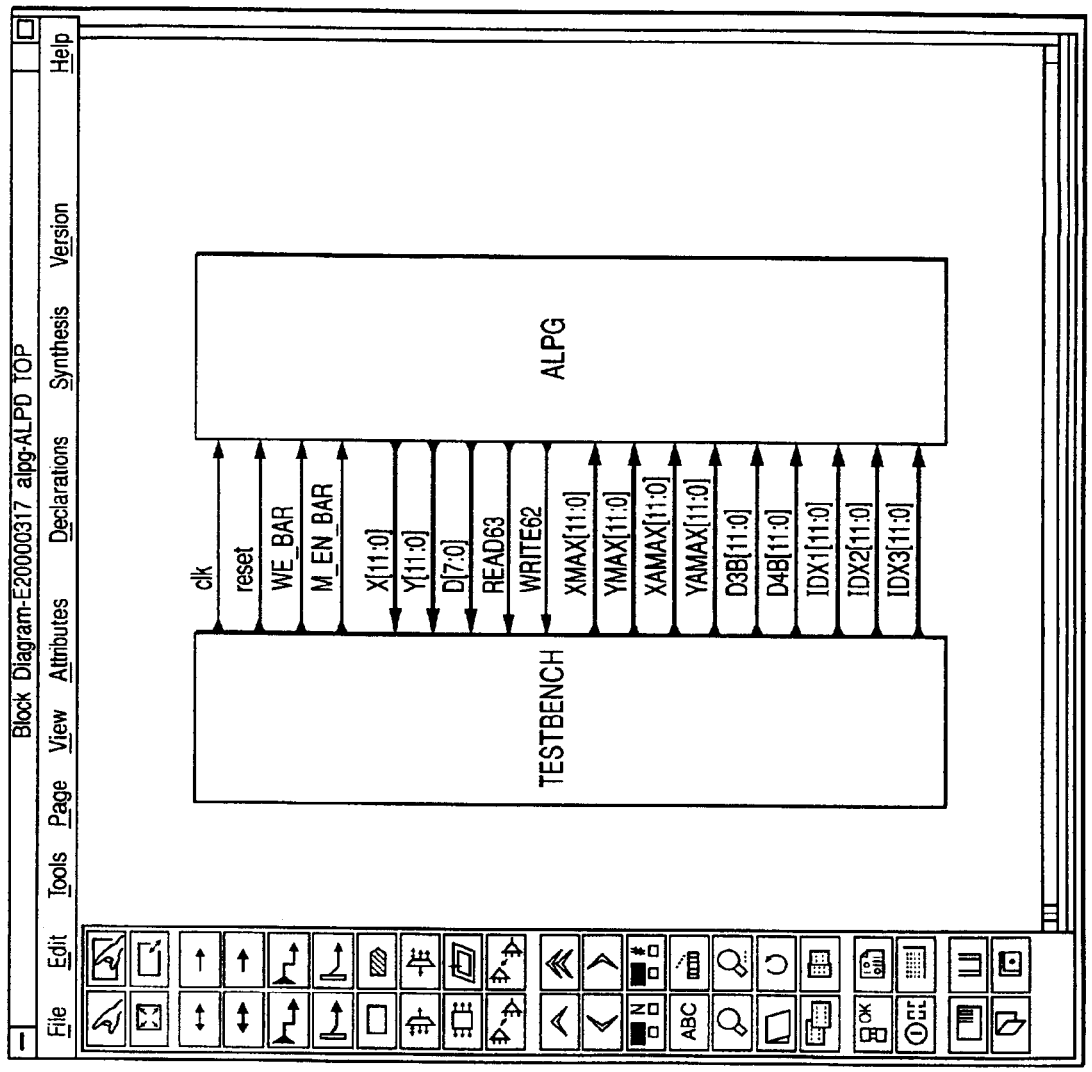
FIG. 16 is a display configuration diagram illustrating a display example of a display screen by a function entry tool available for the generation of ALPG construction data.
Figure 17:
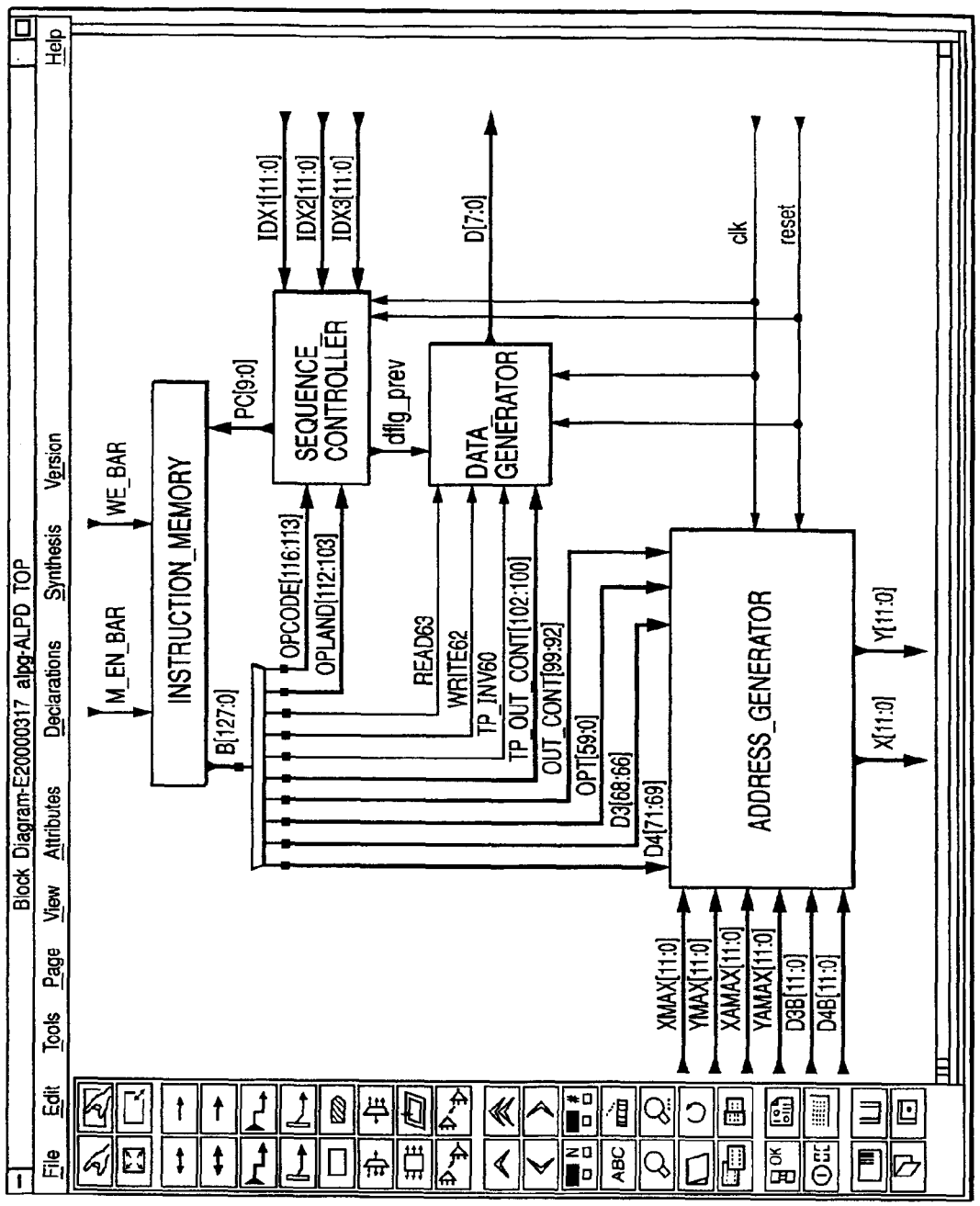
FIG. 17 is a display configuration diagram showing the further detailed contents of an ALPG on the display screen of FIG. 16.

FIG. 16 shows a descriptive screen of a top module. The right block indicates an ALPG. Further, the left block is one wherein a signal source for supplying a clock signal CLK, a reset signal RST, a write enable signal WE_BAR, etc. inputted to the ALPG to thereby start up the ALPG, and destinations for addresses, data, etc. outputted from the ALPG are virtually represented as one block test-bench. Namely, FIG. 16 is a screen for displaying all the input/output signals of the ALPG. When a pointer is placed on the right block and the button is clicked after all the input/output signals of the ALPG are represented on the screen through the use of the left tool, the next screen appears. A basic configuration of the ALPG is represented on the screen in the form of a block diagram as shown in FIG. 17. Further, electrical connections among respective blocks B1, B2, B3, B4 and B5 and the setting of the direction of the input/output of each signal are carried out on the screen.

Figure 18:
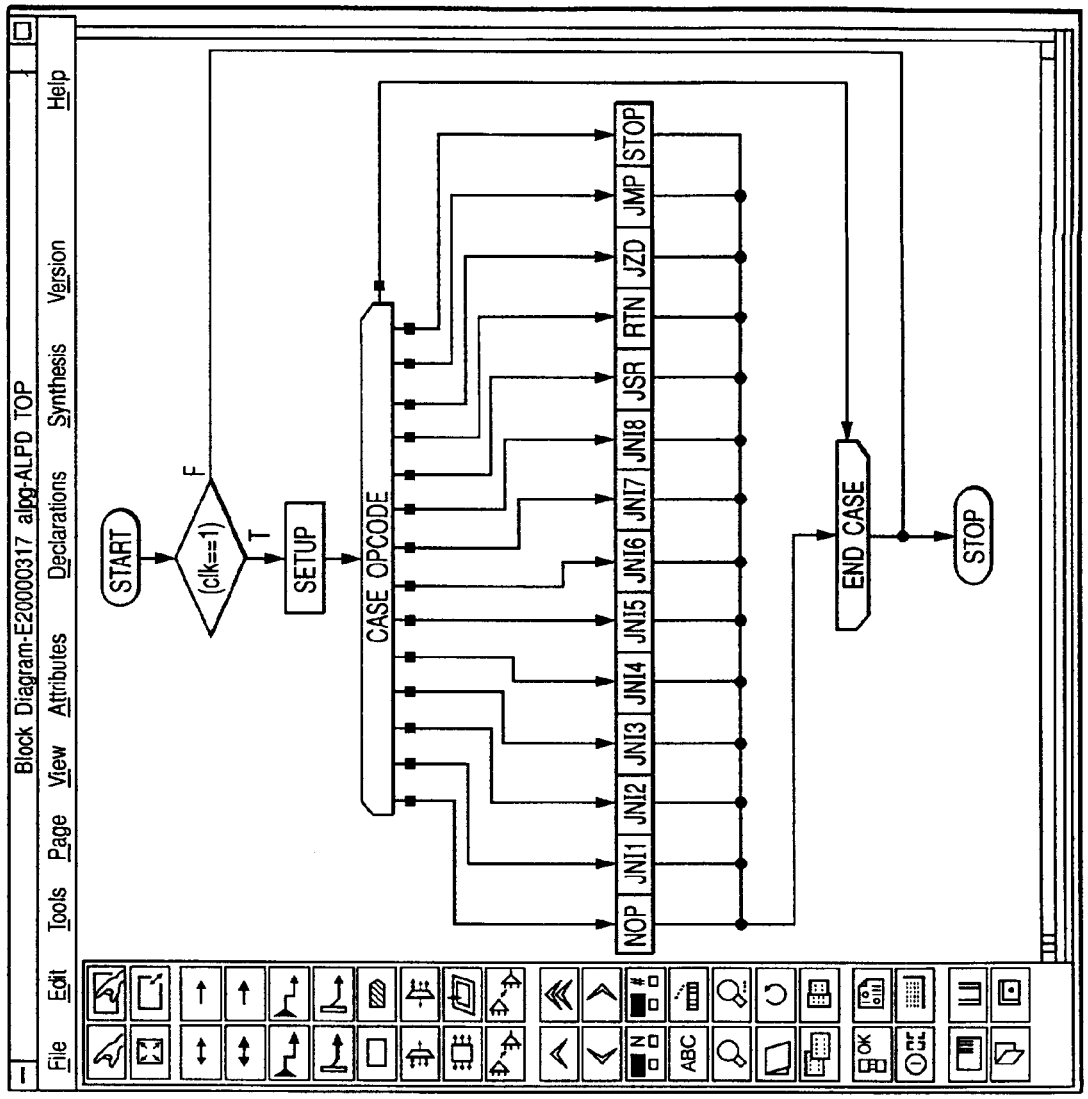
FIG. 18 is a display configuration diagram depicting the detailed contents of a sequence control circuit module on the display screen in the APLG shown in FIG. 17.

When, for example, the block B2 (Sequence Controller) is clicked, a screen related to the sequence controller appears in FIG. 17. The contents of control by the sequence controller is represented on the screen in the form of a flowchart as shown in FIG. 18. Instruction codes or processing, conditions, etc. are described in each block. Further, the corresponding block is clicked in regard to the instructions such as "NOP", "JN1", etc. and the contents of operation like "PC+1→PC" on the right side in Table 1 is inputted via the keyboard. In doing so, an HDL descriptive text related to the sequence controller, which is shown in FIG. 21, is automatically created.

Figure 19:
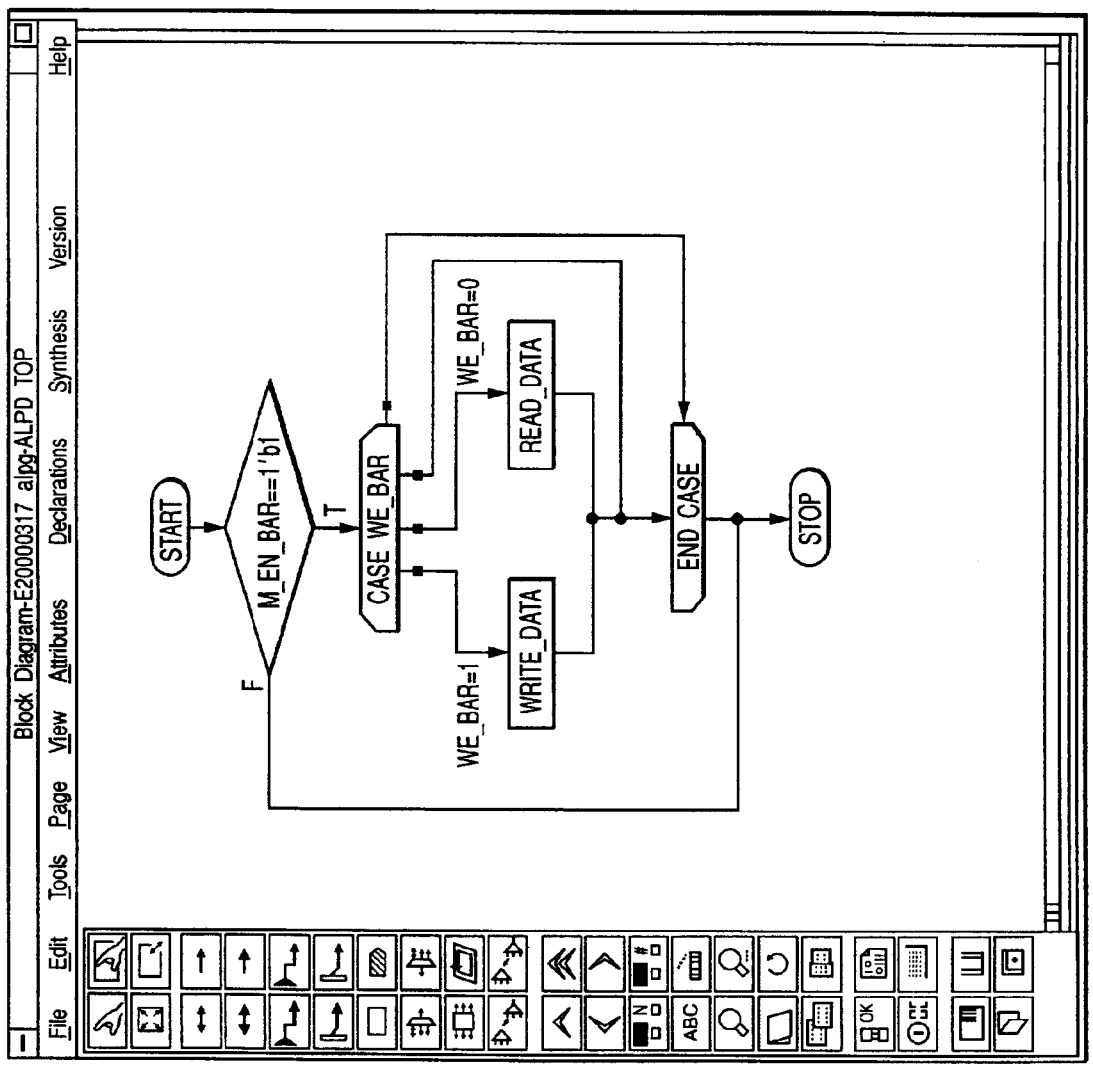
FIG. 19 is a display configuration diagram showing the detailed contents of an instruction memory circuit module on the display screen in the ALPG shown in FIG. 17.
Figure 20:
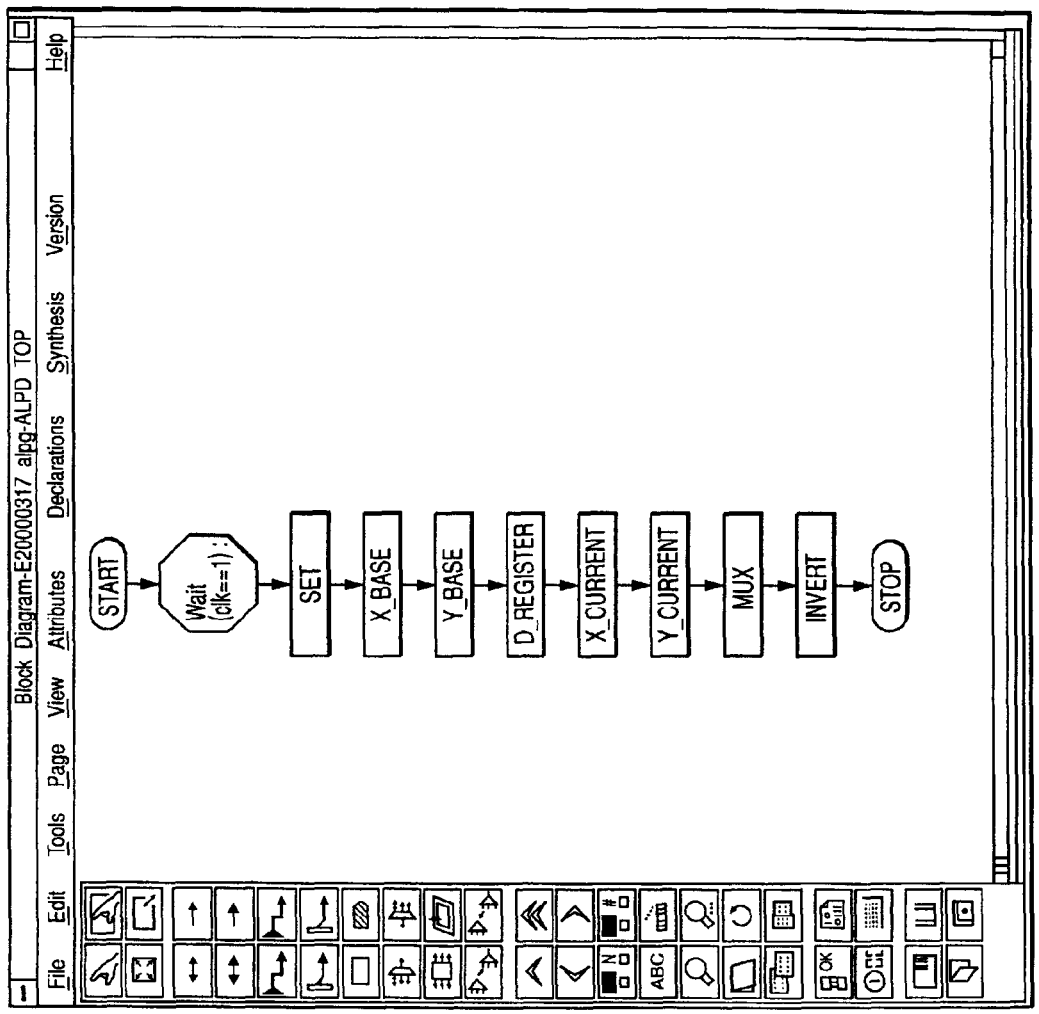
FIG. 20 is a display configuration diagram illustrating the detailed contents of an address operation module on the display screen in the ALPG shown in FIG. 17.

The instruction memory is also similar to the above. The block B1 is clicked in FIG. 17 to display the following screen. Further, such a flowchart as shown in FIG. 19 is created to define conditions, processing, etc. for each individual blocks. In doing so, such an HDL descriptive text as shown in FIG. 22 is automatically created. The address operation circuit is also similar to the above. The block B5 is clicked in FIG. 17 to display the next screen. Thereafter, such a flowchart as shown in FIG. 20 is created to define processing, registers, etc. for each individual blocks, and the contents of operations shown in Tables 2 through 5 are inputted. In doing so, such an HDL descriptive text as shown in FIG. 23 is automatically created. The data operation circuit is also similar to the above. Such an HDL descriptive text as shown in FIG. 24 is automatically created.

Figure 25:
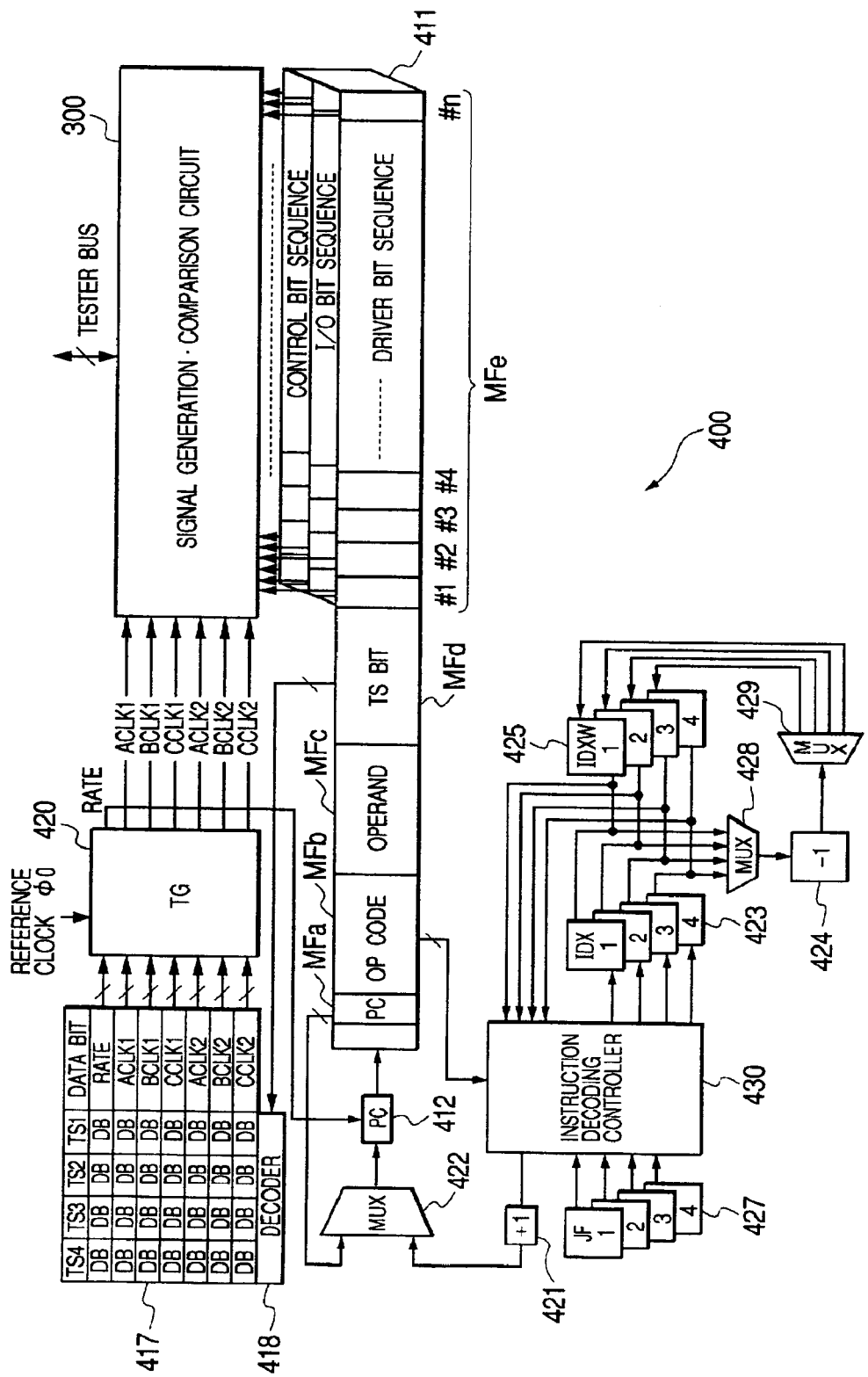
FIG. 25 is a block diagram illustrating a specific configuration example of a shared resource type logic ALPG.

Specific examples each illustrative of a logic ALPG, which is constructed within an FPGA and generates each test pattern where a logic circuit (logic IC) is tested, will next be explained with reference to FIGS. 25 through 29. Of these, FIG. 25 shows an example of a sequence control circuit of a shared resource type ALPG for generating test signals relative to a plurality of input pins in synchronism with several types of common clocks, and FIG. 28 shows an example of a sequence control circuit employed in a per-pin type ALPG wherein test signals relative to respective input pins are generated by discrete circuits.

The sequence controller of the shared resource type logic ALPG has a configuration similar to the ALPG for generating the test pattern of the memory described in the above-described embodiments. As shown in FIG. 25, for example, the sequence controller includes an instruction memory 411 in which a microprogram comprised of a plurality of microinstruction groups described in accordance with a predetermined test pattern generation algorithm is stored, a program counter 412 for specifying a microinstruction to be read from the instruction memory 411, an instruction decoding controller 430 for decoding an instruction code in the microinstruction read from the instruction memory 411 and forming control signals for circuits lying within a sequence control circuit or controller 400, such as the program counter 412, etc., a timing generator 420 for forming timing control signals, based on a reference clock φ0, a data register set 417 for outputting control data for the timing generator 420, based on a timing set bit MFd (TS bit) lying within the microinstruction, a decoder 418 for decoding the timing set bit MFd (TS bit) lying within the microinstruction to read the corresponding control data from the data register set 417, etc.

In the case of the circuit (e.g., ALU: Arithmetic Logic Unit) whose function is specified, of the logic circuits to be tested, a suitable test pattern forming type or system has already been established in most cases. It is therefore possible to generate an efficient test pattern through the use of the property of its test pattern. As for a combinational logic circuit, there is known an efficient test pattern generating method called a D algorithm based on a fault supposing method and an idea corresponding to a single fault that one fault or failure exists in one circuit. Through the use of such a method, a microprogram for generating a test pattern can be shortened, and an increase in the capacity of the instruction memory 411 can be limited to an implementable extent.

Although not restricted in particular in the ALPG employed in the present embodiment, the timing set bit TS decoded by the decoder 418 is comprised of two bits, and seven control data are stored in the data register set 417. One of these control data corresponds to data "RATE" for defining a test cycle, and the remaining six control data respectively correspond to two types of control data "ACLK1" and "ACLK2" for respectively supplying timings provided to output high level or low level signals every signal lines for an ALPG-dedicated bus, two types of control data "BCLK1" and "BCLK2" for respectively supplying timings provided to raise pulse signals, and two types of control data "CCLK1" and "CCLK2" for respectively supplying timing provided to cause each pulse signal to fall, and output timing provided to make a comparison with each expected data.

When these control data are supplied to the timing generator 420, a prescribed timing signal RATE is supplied to the program counter 412 as or in regard to the control data RATE, so that the capturing of a microinstruction code from the instruction memory 411 is done. When "ACLK1" through "CCLK2" are supplied to the timing generator 420 as the control data, clocks corresponding to control codes of the timing clocks ACLK1 through CCLK2 are outputted to a signal generation/comparison circuit 300. Connections and selection for the use of each individual clocks are suitably carried out as needed.

Further, the logic ALPG is provided with an incrementer 421 for incrementing the value of the program counter 412 by "+1", a multiplexer 422 for selecting any of jump addresses lying within the incrementer 31 or an address field MFa and supplying it to the program counter 412, an index register 423 for holding the number of repetitions lying within an operand field MFc, a decrementer 424 for decrementing the value of the corresponding index register 423 by "−1", a working register 425 for holding each value decremented by "−1", a flag 427 indicative of the presence or absence of the transfer of each operand used in each predetermined instruction to the program counter 412, a multiplexer 428 for selectively supplying the values of the registers 423 and 425 to the decrementer 424, a demultiplexer 429 for distributing the value of the decrementer 424 to any plane of at least one working register 425, etc.

In the logic ALPG, the operand field MFc for storing the number of the instruction repetitions in the microinstruction code is provided, and the index register 423 for holding the number of the instruction repetitions is provided. Therefore, when the same test signal is repeatedly produced, the necessary number of microinstructions is reduced and thereby a microprogram can be shortened. In the ALPG employed in the present embodiment, the index register 423, working register 425 and flag 427 are respectively provided in the form of plural planes (four in the drawing). It is therefore possible to easily execute a sub-loop process within a given loop process and a sub-loop process within the sub-loop process and shorten a microprogram.

Figure 26:
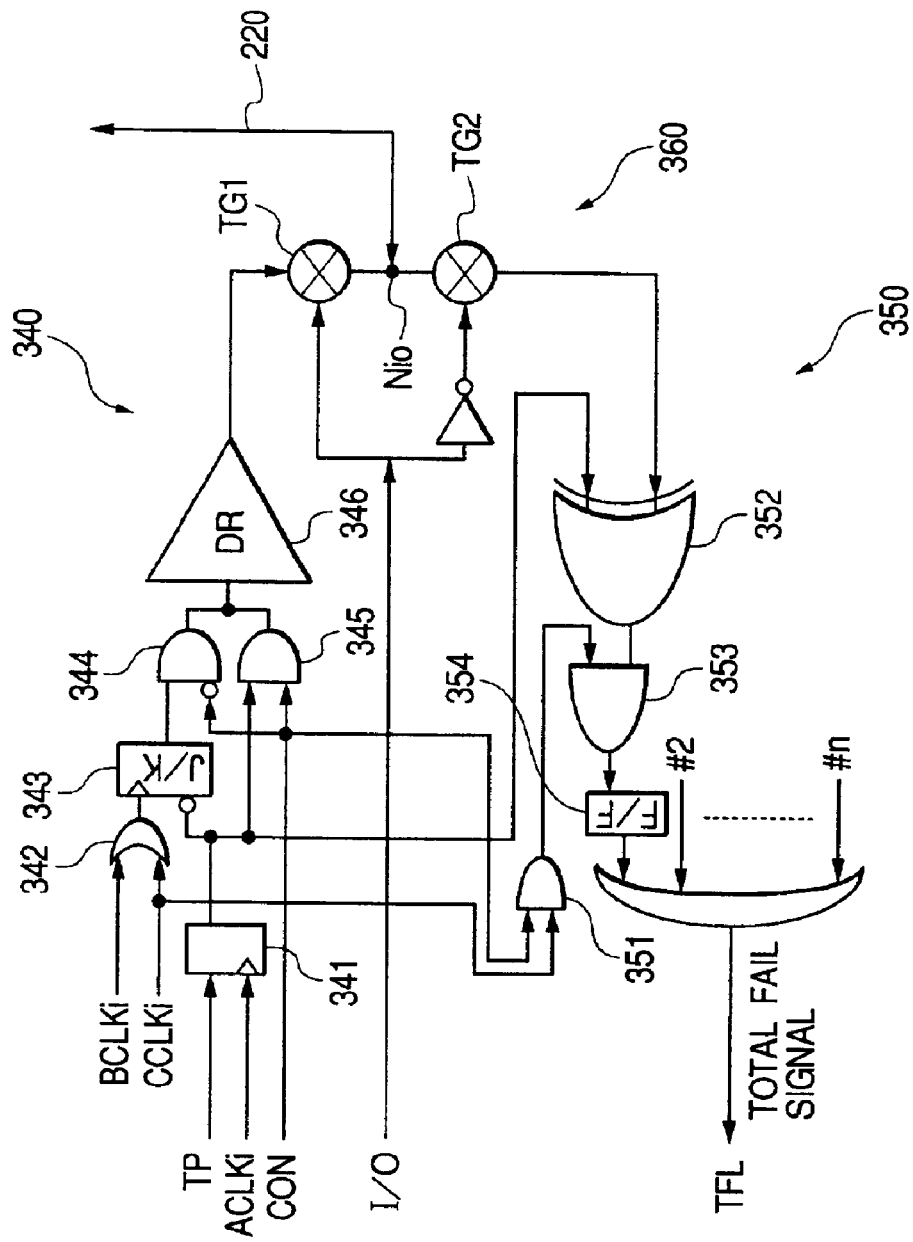
FIG. 26 is a block diagram showing a configuration example of a signal generation/comparison circuit of the ALPG shown in FIG. 25.

FIG. 26 shows an embodiment of the signal generation/comparison circuit 300. Incidentally, only a signal generation/comparison circuit corresponding to one of signal lines each constituting an ALPG-dedicated bus 220 is typically shown in the circuit shown in FIG. 26. However, the circuit shown in FIG. 26 is actually provided by the number of the signal lines each constituting the ALPG-dedicated bus 220.

As shown in FIG. 26, the signal generation/comparison circuit according to the present embodiment comprises a driver circuit (signal generation circuit) 340 for generating a signal to be outputted to the corresponding ALPG-dedicated bus, a comparator circuit (comparison circuit) 350 for comparing the signal on the ALPG-dedicated bus with an expected data signal to thereby make a coincidence/non-coincidence comparison, and a switching circuit 360 for performing switching between the driver 340 and the comparator circuit 350. The switching circuit 360 comprises a transfer gate TG1 provided between the driver circuit 340 and an input/output node Nio, and a transfer gate TG2 provided between the input/output node Nio and the comparator circuit 350. Either one of the transfer gates TG1 and TG2 is rendered open according to an input/output control bit I/O supplied from the sequence control circuit or controller 400, whereas the other thereof is brought to a cut-off state.

The driver circuit 340 comprises an edge trigger type flip-flop 341 for taking it and holding an input/output bit TP in response to a timing clock ACLKi supplied from the timing generator 420, an OR gate 342 for ORing timing clocks BCLKi and CCLKi supplied from the timing generator 420, a J/K flip-flop 343 for receiving the output of the OR gate 342 and the output of the edge trigger type flip-flop 341 as input signals, an AND gate 344 for receiving the output of the J/K flip-flop 343 and an input/output control bit CONT supplied from the sequence controller 400 as input signals, an AND gate 345 for receiving the output of the edge trigger type flip-flop 341 and the input/output control bit CONT supplied from the sequence controller 400 as input signals, and a driver 346 for driving the ALPG-dedicated bus according to the outputs of these AND gates 344 and 345.

On the other hand, the comparator circuit 350 comprises an AND gate 351 for receiving the timing clock CCLKi supplied from the timing generator 420 and the input/output control bit CONT supplied from the sequence controller 400 as input signals, an exclusive-OR gate 352 for receiving the output (expected data) of the D type flip-flop 341 and the signal on the ALPG-dedicated bus supplied through the transfer gate TG2 as input signals, an AND gate 353 for receiving the outputs of the exclusive-OR gate 352 and the AND gate 351 as input signals, and a flip-flop 354 for latching the output of the AND gate 353. A signal obtained by ORing the outputs of all the comparator circuits 350 is outputted as a total fail signal TFL. The input/output control bits I/O, TP and CONT are equivalent to the control signals referred to above.

As shown in FIG. 25, the microinstruction employed in the logic APLG according to the present embodiment comprises an address field MFa in which each PC address indicative of an instruction's jump address employed in a jump instruction is stored, an op code filed MFb in which sequence control codes are stored, an operand field MFc in which the number of repetitions of instructions and the like are stored, a timing set field MFd in which a timing set bit TS for reading each control signal from the data register set 417 to the timing generator 420 is stored, and an input/output control field MFe in which input/output control bits for the signal generation/comparison circuit 300 are stored.

The timing set bit TS stored in the timing set field MFd is represented in the form of two bits in the present embodiment as described above. However, three bits or more may be provided for the timing set bit TS. As the input/output control bits stored in the input/output control field MFe, only n sets are provided in association with n signals lines for the ALPG-dedicated buses 220 with three bits of a driver bit TP, an I/O bit and a control bit CONT as one set. Of these bits, the I/O bit is a control bit for specifying the input or output. When the I/O bit is of "1", it opens the transfer gate TG1 and cuts off the transfer gate TG2 to thereby output a signal outputted from the driver onto its corresponding signal line for the ALPG-dedicated bus 220. When the I/O bit is of "0", it cuts off the transfer gate TG1 and opens the transfer gate TG2 to thereby input the signal on the corresponding signal line for the ALPG-dedicated bus 220 to the comparison gate 352. The driver bit TP and control bit CONT specify a high output or a low output, a positive pulse or a negative pulse, or an input invalid state or an output high impedance state according to their combination.

Table 7 shows the relationship between the input/output control bits TP, I/O and CONT and test signals (test patterns) outputted from the signal generation/comparison circuit 300.

TABLE 7

| Output Test Signal | TP | I/O | CONT | Remarks |
|---|---|---|---|---|
| 1 | 1 | 1 | 1 | Hi Drive |
| 0 | 0 | 1 | 1 | Low Drive |
| P | 1 | 1 | 0 | Positive Pulse |
| N | 0 | 1 | 0 | Negative Pulse |
| H | 1 | 0 | 1 | Hi expectation |
| L | 0 | 0 | 1 | Low expectation |
| X | 1 | 0 | 0 | don't care |
| Z | 0 | 0 | 0 | Reserved (Hi–Z) |

As shown in Table 7, when the input/output control bits TP, I/O and CONT are respectively "111", the driver circuit 340 is controlled so as to output a signal having a high level. When they are "011", the driver circuit 340 is controlled so as to output a signal having a low level. Whey they are "110", the driver circuit 340 is controlled so as to output a positive pulse signal. When they are "110", the driver circuit 340 is controlled so as to output a negative pulse signal. When the input/control bits TP, I/O and CONT are respectively "101", the comparator circuit 350 is controlled so as to expect an input signal high in level. When they are "001", the comparator circuit 350 is controlled so as to expect an input signal low in level. When they are "100", the comparator circuit 350 is controlled so as to invalidate an input signal.

Incidentally, the signal generation/comparison circuit 300 employed in the present embodiment is configured so that the state in which the control bits TP, I/O and CONT are brought to "000" respectively, makes no sense. However, when the control bits TP, I/O and CONT are "000", the signal generation/comparison circuit 300 may be configured so as to close the transfer gate TG1 and open the transfer gate TG2, for example, and to be capable of comparing a state (high impedance state) in which the potential at the input/output node Nio connected to the ALPG-dedicated bus 220 exists, between two levels lying between the high and low level with the exclusive-OR gate 352 as a Schmidt circuit operated at the two levels lying therebetween.

Figure 27:
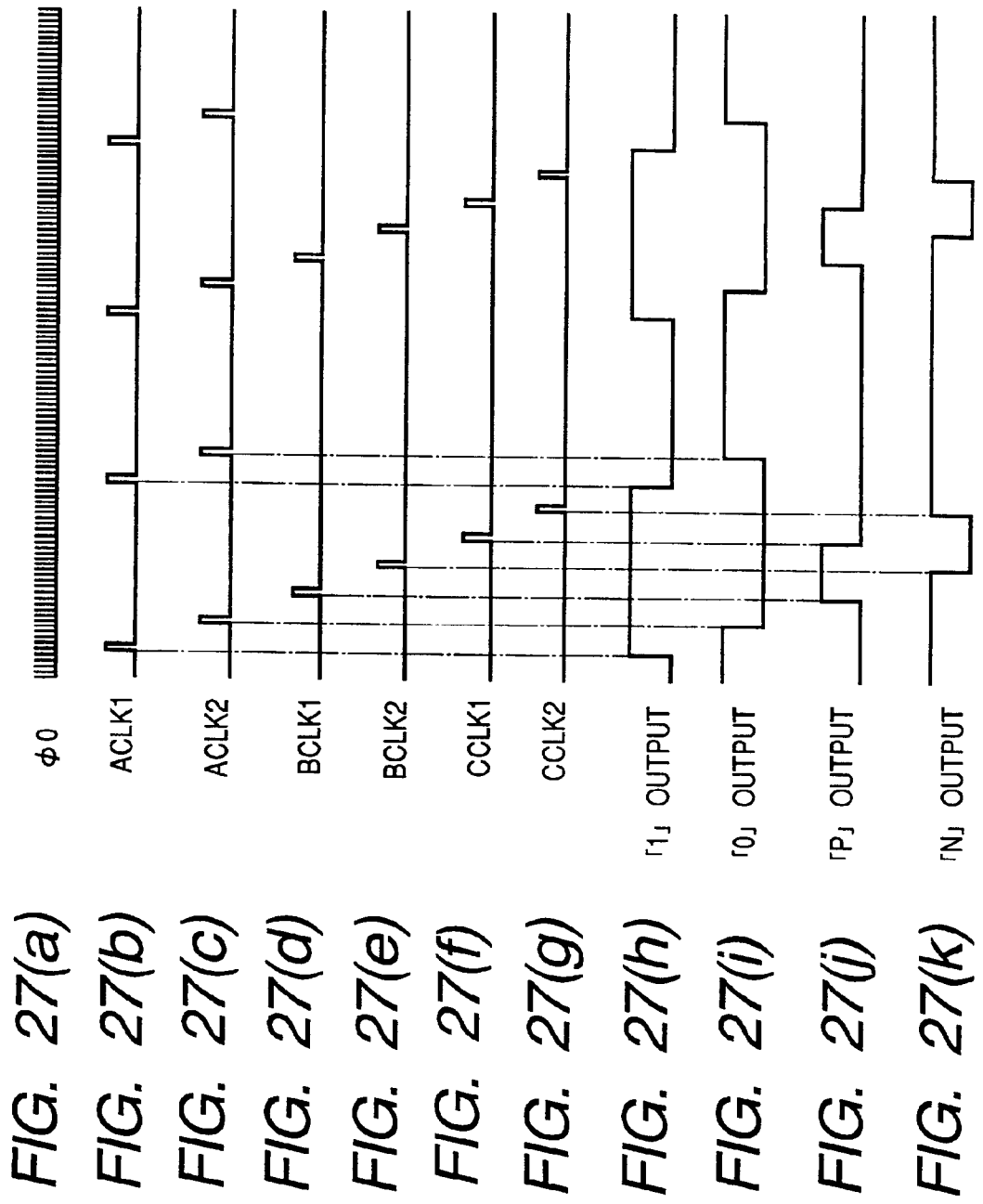
FIG. 27 is a timing chart showing one example illustrative of a timing clock supplied from a timing generator of the ALPG shown in FIG. 25 and signals outputted from the signal generation/comparison circuit onto an ALPG dedicated bus.
Figure 28:
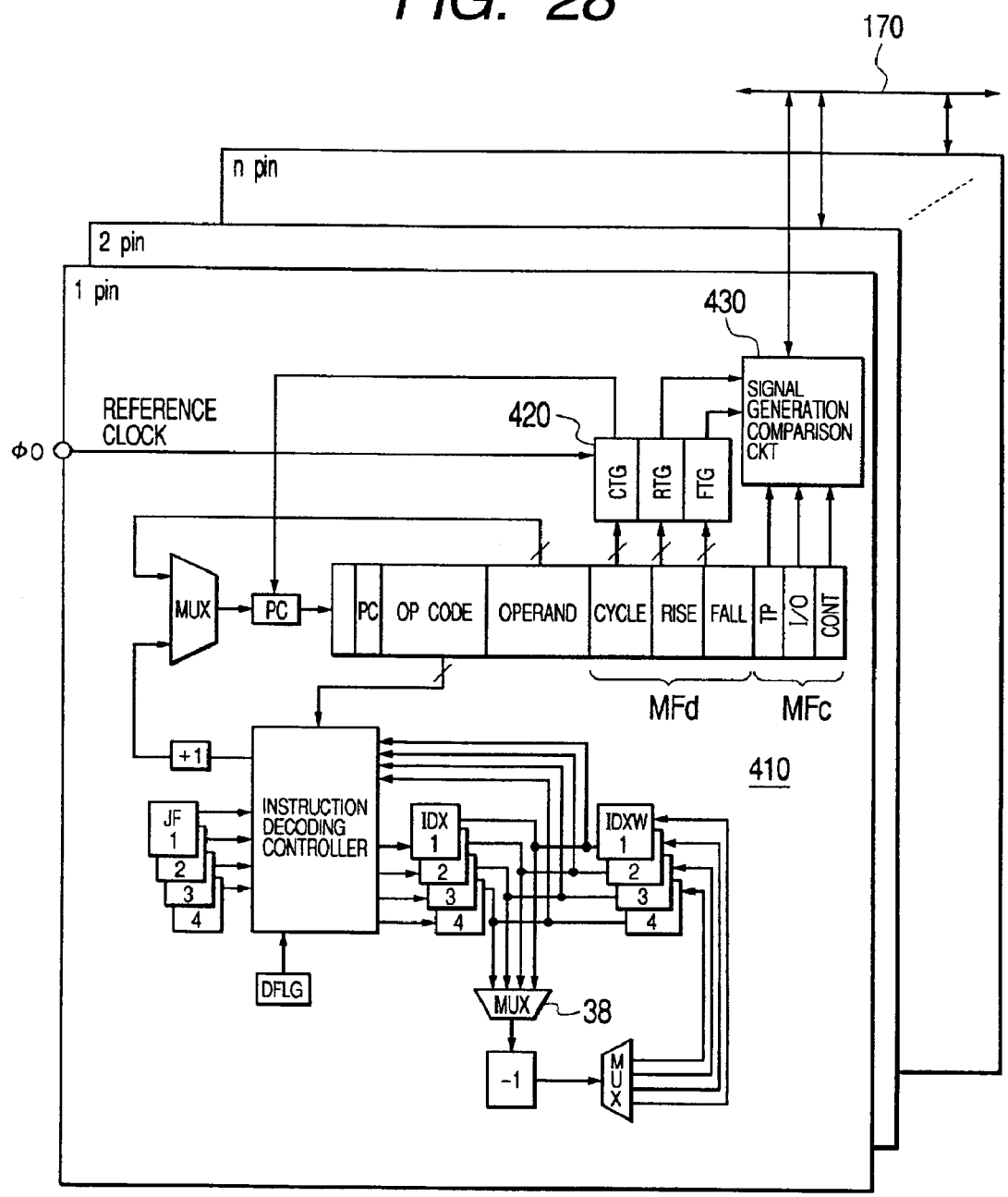
FIG. 28 is a block diagram illustrating a specific configuration diagram of a per-pin type logic ALPG.

FIG. 27 shows one example illustrative of the timing clocks ACLK1 through CCLK2 supplied from the timing generator 420 employed in the above embodiment and the signals outputted onto the ALPG-dedicated bus 220 from the signal generation/comparison circuit 300. In FIG. 27, FIG. 27(*a*) indicates a reference clock φ0 supplied from the outside, FIGS. 27(*b*) through 27(*g*) respectively indicate the waveforms of the timing clocks ALCK1 through CCLK2, and FIG. 27(*h*) indicates the waveform of an output signal at a terminal at which "1" is specified as the output test signal in Table 7 and ACLK1 is selected as the clock. FIG. 27(*i*) indicates the waveform of an output signal at a terminal at which "0" is specified as the output test signal in Table 7 and ACLK2 is selected as the clock. FIG. 27(*j*) indicates the waveform of an output signal at a terminal at which "P" is specified as the output test signal in Table 7 and BCLK1 and CCLK1 are selected as the clocks. Further, FIG. 27(*k*) indicates the waveform of an output signal at a terminal at which "N" is specified as the output test signal in Table 7 and BCLK2 and CCLK2 are selected as the clocks.

As is understood from FIG. 27, such a high level signal as shown in FIG. 27(*h*) is outputted from the terminal at which the input/output control bits TP, I/O and CONT are set to "111" and the clock ACLK1 is specified, in accordance with the clock ALCK1. Such a low level signal as shown in FIG. 27(*i*) is outputted from the terminal at which the input/output control bits TP, I/O and CONT are set to "011" and the clock ACLK2 is specified, in accordance with the clock ALCK2. Such a positive pulse as shown in FIG. 27(*j*) with BCLK1 and CCLK1 as the edges is outputted from the terminal at which the input/output control bits TP, I/O and CONT are set to "110" and the clocks ACLK1, BCLK1 and CCLK1 are specified, in accordance with data set by the clock ALCK1. Such a negative pulse as shown in FIG. 27(*k*) with BCLK2 and CCLK2 as the edges is outputted from the terminal at which the input/output control bits TP, I/O and CONT are set to "010" and the clocks ACLK2, BCLK2 and CCLK2 are specified, in accordance with data set by the clock ALCK2.

Although not illustrated in the drawing, a comparison is made between an expected data as a high level and a signal under controlling of a clock CCLK1 as a strobe signal as shown in FIG. 27(*f*), at the terminal at which the input/output control bits TP, I/O and CONT are set to "101" and the clock CCLK1 is specified. Further, a comparison is made between each expected data as a low level and a signal under controlling of a clock CCLK2 as a strobe signal as shown in FIG. 27(*g*), at the terminal at which the input/output control bits TP, I/O and CONT are set to "001" and the clock CCLK2 is specified. Incidentally, the selection of each clock is not limited to the above and the clocks may be utilized arbitrarily in combination.

Figure 1:
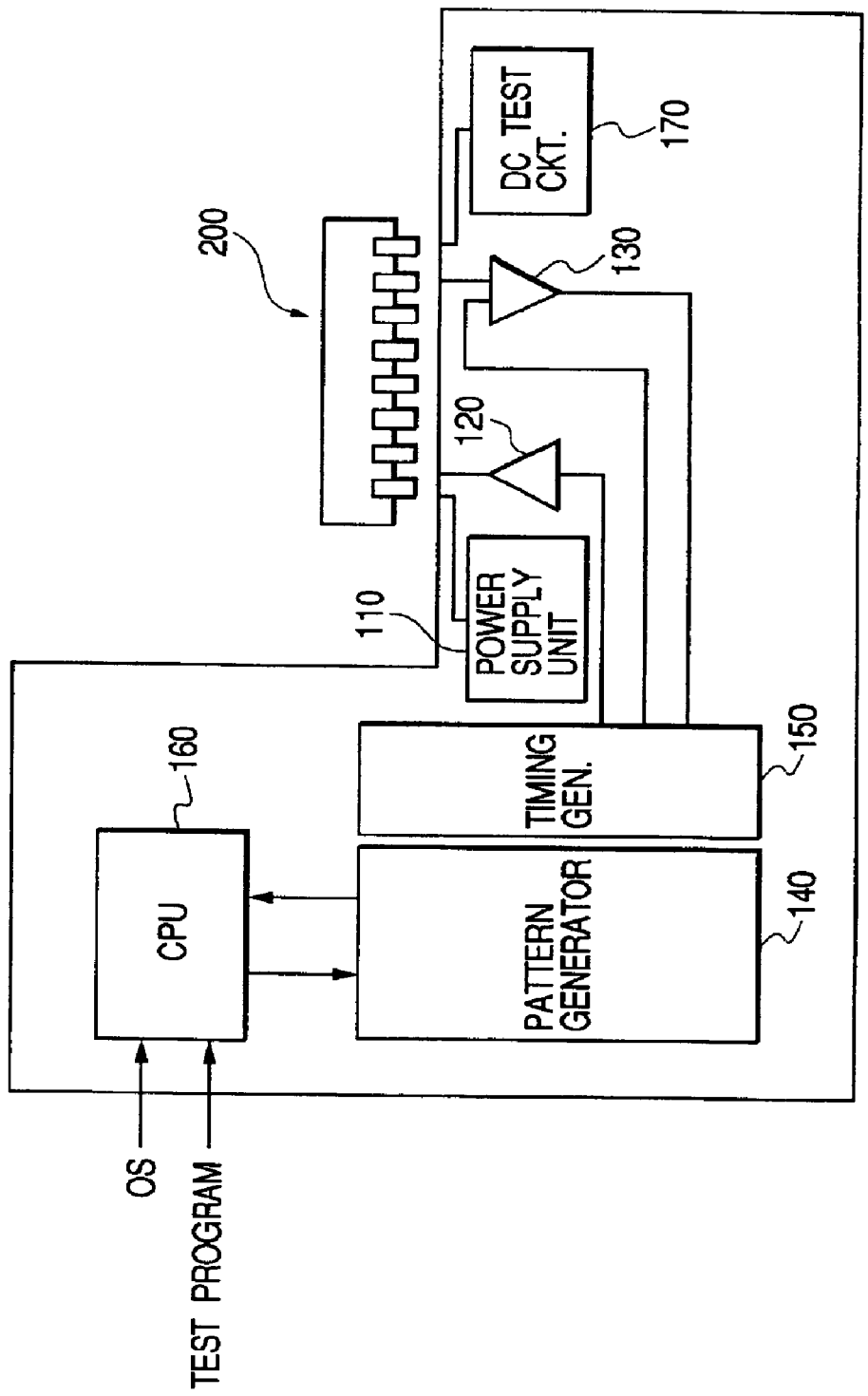
FIG. 1 is a block diagram showing the concept of a conventional general tester.
Figure 2B:
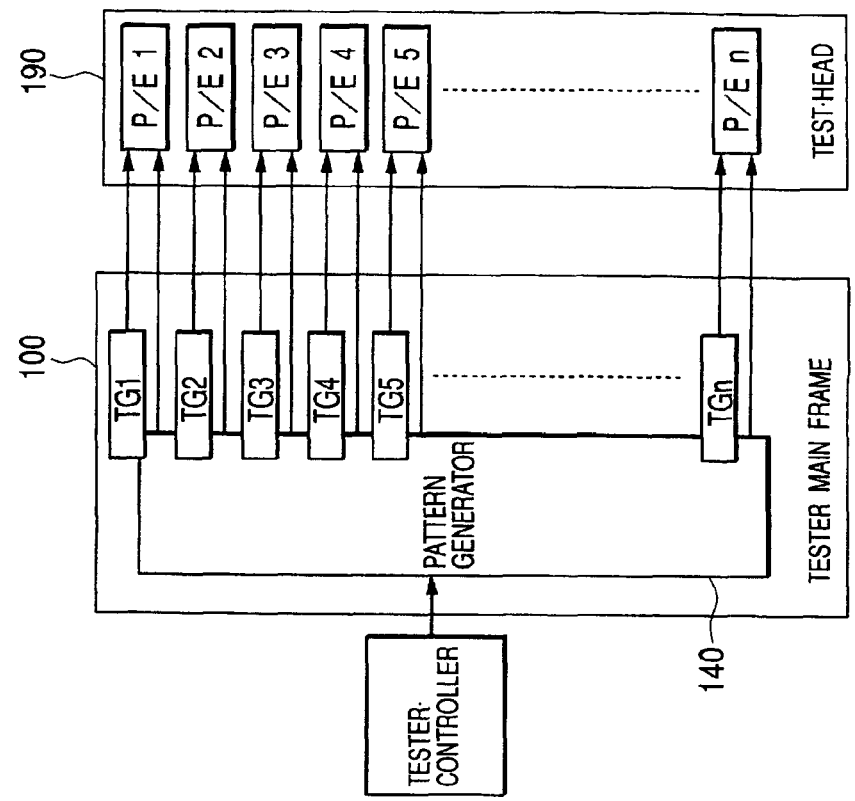
FIG. 2 is a block diagram illustrating the difference in tester method.
Figure 2A:
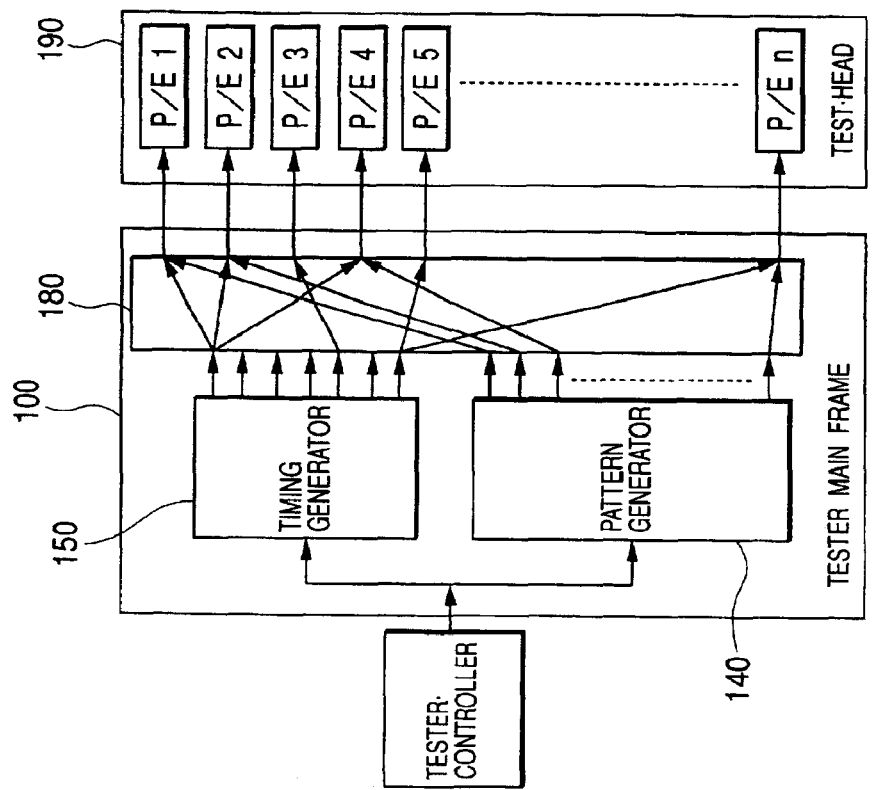
Figure 29:
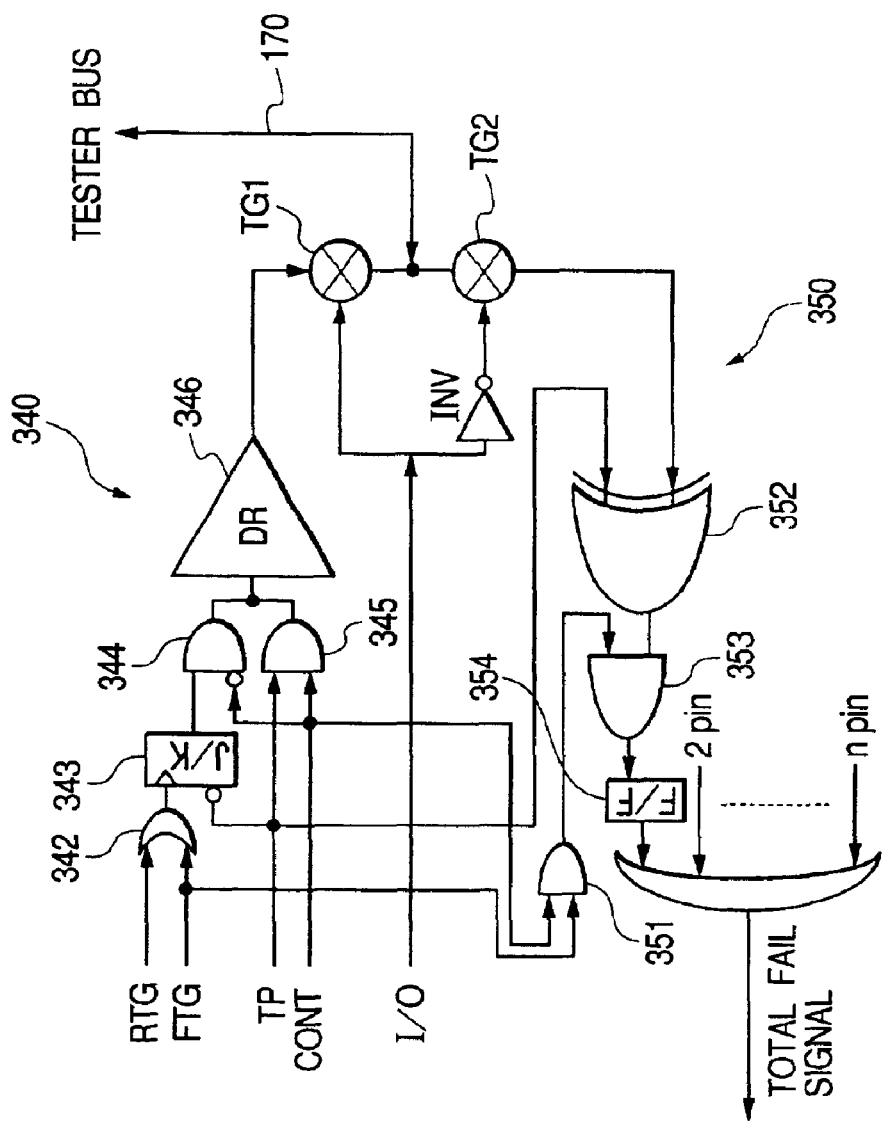
FIG. 29 is a block diagram showing a configuration example of a signal generation/comparison circuit of the ALPG shown in FIG. 28.

FIG. 28 shows the configurations of the per-pin type ALPG and the sequence controllers 410, and FIG. 29 illustrates the configuration of a signal generation/comparison circuit 430 employed in the per-pin type ALPG. Incidentally, the per-pin type ALPG employed in the present embodiment further advances as compared with the per-pin type shown in FIG. 2 (B). The sequence controllers 410 are provided every pins. In FIG. 28, the sequence controllers 410 are provided every signal input terminals of logic ICs to be tested. However, the timing controllers 420 and the signal generation/comparison circuits 430 are provided every signal input terminals of the logic ICs to be tested, in a manner similar to the per-pin type shown in FIG. 2(B), and the sequence controllers 410 for controlling them may be provided as one common circuit.

In the shared resource type ALPG (see FIG. 25), the common sequence control circuit 400 and signal generation/comparison circuit 300 for controlling the generation of the output signals or expected data signals with respect to all the signal lines for the tester bus are provided to form the plural signals according to one microinstruction. On the other hand, in the present per-pin type ALPG, the controllers 410, timing controllers 420, and signal generation/comparison circuits 430 are provided every signals lines for an ALPG-dedicated bus 170. Therefore, a bit length of a microinstruction becomes short and a data compression ratio of a microprogram becomes high as compared with the shared resource type ALPG.

The sequence controller 410 of the per-pin type ALPG shown in FIG. 28 is different from the sequence controller 400 of the shared resource type ALPG shown in FIG. 25 in that in the per-pin type ALPG shown in FIG. 28, control data for the timing generator 420 are directly stored in a timing set field MFd of a microinstruction, a data register set 417 for storing the control data in association therewith is omitted, the timing generator 420 has a configuration corresponding to the construction of the control data lying within the timing set field MFd, only control bits corresponding to three bits about one signal line for the ALPG-dedicated bus 170 are stored in an input/output control field MFe, and a driver circuit 340 (shown in FIG. 29) of the signal generation/comparison circuit 430 has a configuration corresponding to timing clocks outputted from the timing generator 420.

The difference between the two will be described in further details. The control data for the timing generator 420, which are stored in the timing set field MFd of the microinstruction, comprises a cycle control code CYCLE for specifying the frequency or cycle of a test cycle, i.e., a test signal, a control code RISE for specifying a rise timing of a clock signal, and a control code FALL for specifying a fall timing of a clock signal.

On the other hand, the timing generator 420 comprises three down counters operated at a reference clock φ0 and outputs three clock signals CTG, RTG and FTG respectively having timings specified by three control codes lying within the timing set field MFd. The CTG of these clock signals is supplied to a program counter 12 and used to offer or give timing provided to read the microinstruction. The clock signals RTG and FTG are supplied to the signal generation/comparison circuit 430 and used to form a signal having the rising edge corresponding to the RTG and having the falling edge corresponding to the RTG or offer or give comparison timing.

The signal generation/comparison circuit 430 employed in the per-pin type ALPG shown in FIG. 29 is different from the signal generation/comparison circuit 300 of the shared resource type ALPG shown in FIG. 26 only in that the flip-flop 41 latch-operated according to the clock ACLK employed in the shared resource type ALPG is omitted in the per-pin type ALPG, and the clocks RTG and FTG outputted from the timing generator 420 in FIG. 28 are inputted in the per-pin type ALPG in place of the clocks BCLK and CCLK inputted to the OR gate 342 in the circuit shown in FIG. 26. The relationship between input/output control bits TP, I/O and CONT inputted to the signal generation/comparison circuit 430 and the operating state of the signal generation/comparison circuit 430 is similar to Table 7 indicative of the signal generation/comparison circuit 300 of the shared resource type ALPG.

Owing to the construction of the control circuit 410, the timing generator 420 and the signal generation/comparison circuit 430 in the above-described manner, the per-pin type ALPG has an advantage in that while it is necessary to store the microinstructions in their corresponding instruction memories of the controllers 410 every signal lines for the ALPG-dedicated bus 170, the respective microinstructions become short in overall bit length as compared with the shared resource type ALPG, and the number of instruction repetitions and the loop can be set freely, thereby making it possible to compress a microprogram and thereby reduce the number of the microinstructions, and reduce a memory size. The amount of hardware at the control circuit portion in the per-pin type ALPG is much larger than that in the shared resource type ALPG.

Accordingly, either the adoption of the per-pin type ALPG or the shared resource type ALPG may be determined according to the logic circuit (logic IC) to be tested. Namely, when the microprogram can considerably be compressed by execution of the repeat, loop or subroutine processing according to the shared resource system, the shared resource type ALPG may be adopted to reduce the control circuit in scale. When it is not possible to obtain a sufficient compression ratio in the shared resource type, the per-pin type ALPG may be adopted to reduce a memory. When several given signals (pins) can considerably be compressed even in the case of the shared resource type even as to one logic circuit (logic IC), the shared resource type ALPG may be adopted for those signals, whereas the per-pin type ALPG may be adopted for other signals.

Even in the case of the logic ALPG having the above-described configuration in a manner similar to the aforementioned memory ALPG, a test program is analyzed in accordance with the flowchart shown in FIG. 4 to thereby determine the configuration of the ALPG. Further, the components of the ALPG, corresponding to the contents of each test are extracted to generate ALPG construction data, and the ALPG can be constructed within its corresponding FPGA by use of it. Upon generating the ALPG construction data, work can efficiently be carried out on the screen of the display unit through the use of the function entry tool in a manner similar to the memory ALPG.

The invention made above by the present inventors has been described specifically by the illustrated embodiments. However, the present invention is not limited to the aforementioned embodiments. It is needless to say that various changes can be made thereto within the scope not departing from the substance thereof. While, for example, the aforementioned embodiment has described, as an example, the case wherein the ALPG for testing the memory and logic IC is constructed within the FPGA, it can be applied even to a case in which it is constructed within an FPGA for testing an analog integrated circuit. Even in this case, when an ALPG for testing an analog integrated circuit having only a DA converter and having no AD converter is constructed, elements constituting functions for testing the AD converter are omitted with respect to, for example, an ALPG for an analog integrated circuit having an AD converter and a DA converter, and ALPG construction data is generated, for example, whereby a compact ALPG can be constructed.

Incidentally, the technology of constructing a test circuit for testing an analog circuit within an FPGA has been disclosed in Japanese Patent filed No. 11(1999)-258554 and the like previously proposed by the present inventors. Thus, it can easily be implemented by use of it. However, the language for describing data used for constructing a test circuit for testing an analog circuit within an FPGA may includes an analog HDL, an SHDL (Spectrum HDL), etc.

Further, as to a test on each memory, a test program for the memory might include not only control on the test but also a defective or faulty bit relief process or the like. Since the defective bit relief process can also be carried out in accordance with a predetermine algorithm in the memory, the test program is analyzed and a relief processing circuit is also described in HDL. Therefore, a relief circuit is constructed within an FPGA from the HDL description and the defective bit relief for the memory may be carried out by such a relief circuit.

An advantageous effect obtained by a typical one of the inventions disclosed in the present application will be described in brief as follows:

According to the present invention, test circuit architecture construction data described in HDL can be created, and a test circuit can be constructed within an FPGA or the like capable of constituting arbitrary logic by use of the data. Therefore, a semiconductor device to be tested can be tested through the use of such a test circuit without having to use a commercially-available large tester. Re-constructing the test circuit within the FPGA or the like according to the type of test makes it possible to drastically reduce the amount of hardware necessary for the test circuit and carry out tests at low cost.

What is claimed is:

1. A construction data generating method for an architecture of a semiconductor device tester comprising the steps of:
preparing a testing program related to a semiconductor device to be tested by the semiconductor device tester, said testing program being described in a tester language for scripting a plurality of test patterns or test functions;
determining a configuration of a testing circuit having a test function corresponding to contents of a test to be executed by the semiconductor device tester, based on analysis by the testing program; and
generating construction data of the testing circuit in a hardware description language, based on the determined configuration, thereby constructing the testing circuit within a variable logic circuit capable of constituting arbitrary logic.

2. The construction data generating method for an architecture of a semiconductor device tester according to claim 1, wherein the testing circuit determined by the analysis of the testing program has an inherent configuration most suitable for the contents of the test to be executed.

3. The construction data generating method for an architecture of a semiconductor device tester according to claim 2, wherein the description of the testing circuit in the hardware description language is carried out through the use of a development support program for displaying a logical configuration and a connection relation on the screen of a display unit according to an instruction issued via a man machine interface device, and generating the descriptive data represented in the hardware description language based on the displayed logical configuration and connection relation.

4. The construction data generating method for an architecture of a semiconductor device tester according to claim 3, wherein the semiconductor device to be tested is a semiconductor memory device, and the testing circuit includes:

a sequence controller which decodes an instruction code
to thereby generate control signals in accordance with
a predetermined order;

an instruction storage unit which stores an instruction
code to be supplied to said sequence controller;

a signal generation/comparison unit which successively
generates input signals and expected data signals for
the semiconductor device to be tested, in accordance
with the control signals produced from said sequence
controller and compares each of signals outputted from
the semiconductor device with said each expected data
signal; and a timing generation unit which generates timings provided
to input the signals to the semiconductor device to be
tested in said signal generation/comparison unit in
accordance with the control signals outputted from said
sequence controller.

5. The construction data generating method for an architecture of a semiconductor device tester according to claim 3, wherein the semiconductor device to be tested is a semiconductor memory device, and the testing circuit includes:

a sequence controller which decodes an instruction code
to thereby generate control signals in accordance with
a predetermined order;

an instruction storage unit which stores an instruction
code to be supplied to said sequence controller, a signal generation/comparison unit which successively
generates input signals and expected data signals for
the semiconductor device to be tested, in accordance
with the control signals produced from said sequence
controller and compares each of signals outputted from
the semiconductor device with said each expected data
signal; and a timing generation unit which generates timings provided
to input the signals to the semiconductor device to be
tested in said signal generation/comparison unit in
accordance with the control signals outputted from said
sequence controller.

6. The construction data generating method for an architecture of a semiconductor device tester according to claim 2, wherein the semiconductor device to be tested is a semiconductor memory device, and the testing circuit includes:

a sequence controller which decodes an instruction code
to thereby generate control signals in accordance with
a predetermined order;

an instruction storage unit which stores an instruction
code to be supplied to said sequence controller;

an address operation unit which successively generates
address signals for the semiconductor device to be
tested, in accordance with the control signals generated
from said sequence controller; and a data operation unit which successively generates data
signals for the semiconductor device to be tested, in
accordance with the control signals produced from said
sequence controller.

7. The construction data generating method for an architecture of a semiconductor device tester according to claim 2, wherein the semiconductor device to be tested is a semiconductor memory device, and the testing circuit includes:

a sequence controller which decodes an instruction code
to thereby generate control signals in accordance with
a predetermined order;

an instruction storage unit which stores an instruction
code to be supplied to said sequence controller;

a signal generation/comparison unit which successively
generates input signals and expected data signals for
the semiconductor device to be tested, in accordance
with the control signals produced from said sequence
controller and compares each of signals outputted from
the semiconductor device with said each expected data
signal; and a timing generation unit which generates timings provided
to input the signals to the semiconductor device to be
tested in said signal generation/comparison unit in
accordance with the control signals outputted from said
sequence controller.

8. The construction data generating method for an architecture of a semiconductor device tester according to claim 1, wherein the testing circuit determined by the analysis of the testing program has a configuration including a plurality of tester architecture different from one another.

9. The construction data generating method for an architecture of a semiconductor device tester according to claim 8, wherein the description of the testing circuit in the hardware description language is carried out through the use of a development support program for displaying a logical configuration and a connection relation on the screen of a display unit according to an instruction issued via a man machine interface device, and generating the descriptive data represented in the hardware description language based on the displayed logical configuration and connection relation.

10. The construction data generating method for an architecture of a semiconductor device tester according to claim 9, wherein the semiconductor device to be tested is a semiconductor memory device, and the testing circuit includes:

a sequence controller which decodes an instruction code
to thereby generate control signals in accordance with
a predetermined order;

an instruction storage unit which stores an instruction
code to be supplied to said sequence controller;

a signal generation/comparison unit which successively
generates input signals and expected data signals for
the semiconductor device to be tested, in accordance
with the control signals produced from said sequence
controller and compares each of signals outputted from
the semiconductor device with said each expected data
signal; and a timing generation unit which generates timings provided
to input the signals to the semiconductor device to be
tested in said signal generation/comparison unit in
accordance with the control signals outputted from said
sequence controller.

11. The construction data generating method for an architecture of a semiconductor device tester according to claim 9, wherein the semiconductor device to be tested is a semiconductor memory device, and the testing circuit includes:

a sequence controller which decodes an instruction code
to thereby generate control signals in accordance with
a predetermined order;

an instruction storage unit which stores an instruction
code to be supplied to said sequence controller;

a signal generation/comparison unit which successively
generates input signals and expected data signals for
the semiconductor device to be tested, in accordance
with the control signals produced from said sequence controller and compares each of signals outputted from the semiconductor device with said each expected data signal; and a timing generation unit which generates timings provided to input the signals to the semiconductor device to be tested in said signal generation/comparison unit in accordance with the control signals outputted from said sequence controller.

12. The construction data generating method for an architecture of a semiconductor device tester according to claim 8, wherein the semiconductor device to be tested is a semiconductor memory device, and the testing circuit includes:

a sequence controller which decodes an instruction code to thereby generate control signals in accordance with a predetermined order;

an instruction storage unit which stores an instruction code to be supplied to said sequence controller;

an address operation unit which successively generates address signals for the semiconductor device to be tested, in accordance with the control signals generated from said sequence controller; and a data operation unit which successively generates data signals for the semiconductor device to be tested, in accordance with the control signals produced from said sequence controller.

13. The construction data generating method for an architecture of a semiconductor device tester according to claim 8, wherein the semiconductor device to be tested is a semiconductor memory device, and the testing circuit includes:

a sequence controller which decodes an instruction code to thereby generate control signals in accordance with a predetermined order;

an instruction storage unit which stores an instruction code to be supplied to said sequence controller;

a signal generation/comparison unit which successively generates input signals and expected data signals for the semiconductor device to be tested, in accordance with the control signals produced from said sequence controller and compares each of signals outputted from the semiconductor device with said each expected data signal; and a timing generation unit which generates timings provided to input the signals to the semiconductor device to be tested in said signal generation/comparison unit in accordance with the control signals outputted from said sequence controller.

14. The construction data generating method for an architecture of a semiconductor device tester according to claim 1, wherein the description of the testing circuit in the hardware description language is carried out through the use of a development support program for displaying a logical configuration and a connection relation on the screen of a display unit according to an instruction issued via a man machine interface device, and generating the descriptive data represented in the hardware description language based on the displayed logical configuration and connection relation.

15. The construction data generating method for an architecture of a semiconductor device tester according to claim 14, wherein the semiconductor device to be tested is a semiconductor memory device, and the testing circuit includes:

a sequence controller which decodes an instruction code to thereby generate control signals in accordance with a predetermined order;

an instruction storage unit which stores an instruction code to be supplied to said sequence controller;

an address operation unit which successively generates address signals for the semiconductor device to be tested, in accordance with the control signals generated from said sequence controller; and a data operation unit which successively generates data signals for the semiconductor device to be tested, in accordance with the control signals produced from said sequence controller.

16. The construction data generating method for an architecture of a semiconductor device tester according to claim 14, wherein the semiconductor device to be tested is a semiconductor memory device, and the testing circuit includes:

a sequence controller which decodes an instruction code to thereby generate control signals in accordance with a predetermined order;

an instruction storage unit which stores an instruction code to be supplied to said sequence controller;

a signal generation/comparison unit which successively generates input signals and expected data signals for the semiconductor device to be tested, in accordance with the control signals produced from said sequence controller and compares each of signals outputted from the semiconductor device with said each expected data signal; and a timing generation unit which generates timings provided to input the signals to the semiconductor device to be tested in said signal generation/comparison unit in accordance with the control signals outputted from said sequence controller.

17. The construction data generating method for an architecture of a semiconductor device tester according to claim 1, wherein the semiconductor device to be tested is a semiconductor memory device, and the testing circuit includes:

a sequence controller which decodes an instruction code to thereby generate control signals in accordance with a predetermined order;

an instruction storage unit which stores an instruction code to be supplied to said sequence controller;

an address operation unit which successively generates address signals for the semiconductor device to be tested, in accordance with the control signals generated from said sequence controller; and a data operation unit which successively generates data signals for the semiconductor device to be tested, in accordance with the control signals produced from said sequence controller.

18. The construction data generating method for an architecture of a semiconductor device tester according to claim 1, wherein the semiconductor device to be tested is a semiconductor memory device, and the testing circuit includes:

a sequence controller which decodes an instruction code to thereby generate control signals in accordance with a predetermined order;

an instruction storage unit which stores an instruction code to be supplied to said sequence controller;

a signal generation/comparison unit which successively generates input signals and expected data signals for the semiconductor device to be tested, in accordance with the control signals produced from said sequence controller and compares each of signals outputted from the semiconductor device with said each expected data signal; and a timing generation unit which generates timings provided to input the signals to the semiconductor device to be tested in said signal generation/comparison unit in accordance with the control signals outputted from said sequence controller.

19. The construction data generating method for an architecture of a semiconductor device tester according to claim 18, herein said signal generation/comparison unit and said timing generator are provided in association with each individuals of a plurality of signal input terminals of a semiconductor device to be tested.

20. The construction data generating method for an architecture of a semiconductor device tester according to claim 1, wherein said variable logic circuit is formed on the same chip as a circuit to be tested by the testing circuit constructed within the variable logic circuit.

21. A construction data generating method for an architecture of a semiconductor device tester according to claim 1, further comprising the steps of: extracting said test function required for testing the semiconductor device from the testing program having the plurality of test functions scripted respectively corresponding to test contents; and testing the semiconductor device by use of data indicative of the extracted test function.

22. A testing circuit for testing a semiconductor device constructed on the same semiconductor chip, comprising:

a sequence controller which decodes an instruction code to thereby generate control signals in accordance with a predetermined order;

an instruction storage unit which stores an instruction code to be supplied to said sequence controller;

a testing signal generation/comparison unit which successively generates input signals and expected data signals for the semiconductor device to be tested, in accordance with the control signals produced from said sequence controller and compares each of signals outputted from the semiconductor device with said each expected data signal; and a testing signal timing generation unit which generates timings provided to input the signals to the semiconductor device to be tested in said testing signal generation/comparison unit in accordance with the control signals outputted from said sequence controller, wherein based on a compression ratio of the instruction code stored in said instruction storage unit, said testing signal generation/comparison unit and said testing signal timing generation unit are provided as circuits common to a plurality of signal input terminals of the semiconductor device to be tested, or circuits independent of one another in association with the respective signal input terminals of the semiconductor device, and said testing circuit is constructed within a variable logic circuit capable of constituting arbitrary logic on the semiconductor chip.

23. The testing circuit for testing a semiconductor device according to claim 22, wherein a sequence controller for controlling said testing signal generation/comparison unit and said testing signal timing generation unit provided as the circuits common to the plurality of signal input terminals of the semiconductor device to be tested is configured as a common control unit, and sequence controllers for controlling said testing signal generation/comparison units and said testing signal timing generation units provided independently of the respective signal input terminals of the semiconductor device to be tested, are configured as circuits independent of one another in association with the respective signal input terminals.

24. A construction data generating system for an architecture of a semiconductor device tester, comprising:

a testing program having a plurality of functions corresponding to test contents of a semiconductor device to be tested by the semiconductor device tester, said testing program being described in a tester language;

means for determining a configuration of a testing circuit having a test function necessary for testing of the semiconductor device, based on analysis by the testing program; and means for generating construction data of the testing circuit based on the determined configuration, thereby constructing the testing circuit within a variable logic circuit capable of constituting arbitrary logic.

25. The system according to claim 24, wherein said construction data is a hardware description language.

26. The system according to claim 25, wherein the testing circuit is configured based on the construction data.

27. The system according to claim 24, wherein the testing circuit is configured based on the construction data.

* * * * *